US012563753B2

(12) United States Patent
Kim et al.

(10) Patent No.: US 12,563,753 B2
(45) Date of Patent: Feb. 24, 2026

(54) SEMICONDUCTOR DEVICE AND METHOD OF MANUFACTURING THE SAME

(71) Applicant: SK hynix Inc., Gyeonggi-do (KR)

(72) Inventors: Il Do Kim, Gyeonggi-do (KR); Wan Sup Shin, Gyeonggi-do (KR); Jae Sun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 389 days.

(21) Appl. No.: 18/456,519

(22) Filed: Aug. 28, 2023

(65) Prior Publication Data

US 2024/0292633 A1      Aug. 29, 2024

(30) Foreign Application Priority Data

Feb. 28, 2023     (KR) ........................ 10-2023-0026636

(51) Int. Cl.
| | |
|---|---|
| *H10B 80/00* | (2023.01) |
| *H01L 23/00* | (2006.01) |
| *H01L 25/00* | (2006.01) |
| *H01L 25/065* | (2023.01) |
| *H01L 25/18* | (2023.01) |
| *H10B 12/00* | (2023.01) |

(52) U.S. Cl.
CPC ............. *H10B 80/00* (2023.02); *H01L 24/08* (2013.01); *H01L 24/80* (2013.01); *H01L 25/0657* (2013.01); *H01L 25/18* (2013.01);

*H01L 25/50* (2013.01); *H10B 12/03* (2023.02); *H10B 12/05* (2023.02); *H10B 12/30* (2023.02); *H01L 2224/08145* (2013.01); *H01L 2224/80895* (2013.01); *H01L 2224/80896* (2013.01); *H01L 2924/1431* (2013.01); *H01L 2924/1436* (2013.01)

(58) Field of Classification Search
CPC ........ H10B 80/00; H10B 12/05; H10B 12/30; H10B 12/03; H01L 24/08; H01L 24/80; H01L 25/0657; H01L 25/18; H01L 25/50; H01L 2224/08145; H01L 2224/80895; H01L 2224/80896; H01L 2924/1431; H01L 2924/1436
USPC ........................................................ 257/296
See application file for complete search history.

(56) References Cited

U.S. PATENT DOCUMENTS 12,424,575 B2 *     9/2025   Oh .......................... H10B 43/40

* cited by examiner

*Primary Examiner* — Tu-Tu V Ho
(74) *Attorney, Agent, or Firm* — IP & T GROUP LLP

(57) ABSTRACT

A semiconductor device may include a peripheral circuit portion, a memory cell array disposed over the peripheral circuit portion and including a vertical conductive line, a bonding pad structure between the peripheral circuit portion and the memory cell array, a dielectric pad layer configured to cover the top of the vertical conductive line of the memory cell array, and a higher-level pad that is coupled to the vertical conductive line through the dielectric pad layer.

16 Claims, 20 Drawing Sheets

FIG. 2A

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2023-0026636 filed on Feb. 28, 2023, which is incorporated herein by reference in its entirety.

BACKGROUND

1. Field

The technical field of the present relates generally to semiconductor device technology and, more particularly, to three-dimensional semiconductor devices and methods of manufacturing the same.

2. Discussion of the Related Art

Recently, in order to handle the high capacity and fineness of a memory device, a technology providing three-dimensional (3-D) memory devices in which memory cells are stacked in various 3-D arrangements have been proposed.

SUMMARY

Various embodiments of the present application are directed to a semiconductor device including a plurality of memory cells arranged in a three-dimensional arrangement, and a method of manufacturing the semiconductor device. The semiconductor device exhibits high integration and a fast operating speed.

In an embodiment of the present disclosure, a semiconductor device may include a peripheral circuit portion; a memory cell array disposed over the peripheral circuit portion and comprising a vertical conductive line; a bonding pad structure between the peripheral circuit portion and the memory cell array; a dielectric pad layer that covers a top of the vertical conductive line of the memory cell array; and a higher-level pad that is coupled to the vertical conductive line through the dielectric pad layer.

In an embodiment, a semiconductor device may include a lower structure; a dielectric pad layer that covers an upper surface of the lower structure; a first edge slit and a second edge slit that are spaced apart from each other and disposed over the dielectric pad layer; an isolation slit that is disposed between the first edge slit and the second edge slit; a first horizontal conductive line stack that is disposed between the first edge slit and the isolation slit; a second horizontal conductive line stack that is disposed between the second edge slit and the isolation slit; and a plurality of supporting elements that are adjacent to the isolation slit and that comprise the first horizontal conductive line stack and the second horizontal conductive line stack.

In one embodiment, a method of manufacturing a semiconductor device may include forming a plurality of semiconductor layers that are vertically arranged by being isolated from a surface of a lower structure; forming a dummy sacrificial layer that covers the surface of the lower structure; forming sacrificial dielectric layers that surround the semiconductor layers, respectively, and gaps between the semiconductor layers; forming, on the sacrificial dielectric layers, a cell isolation layer that fills the gaps; exposing a surface of the dummy sacrificial layer by removing a portion of the cell isolation layer; forming an air gap on the surface of the lower structure by selectively removing the dummy sacrificial layer; forming a dielectric pad layer that fills the air gap; and replacing the sacrificial dielectric layers with the horizontal conductive lines. The sacrificial dielectric layers and the dielectric pad layer comprise different materials. The dielectric pad layer comprises silicon oxide. The forming of the dielectric pad layer comprises an oxidation process or a deposition process. The method further comprising, after replacing the sacrificial dielectric layers with the horizontal conductive lines, forming a vertical conductive line that is coupled to one sides of the semiconductor layers; and forming data storage elements that are coupled to the other sides of the semiconductor layers, respectively.

BRIEF DESCRIPTION OF THE DRAWINGS

FIG. 2A is a cross-sectional view taken along line A-A' in FIG. 1.

DETAILED DESCRIPTION

Figure 1:
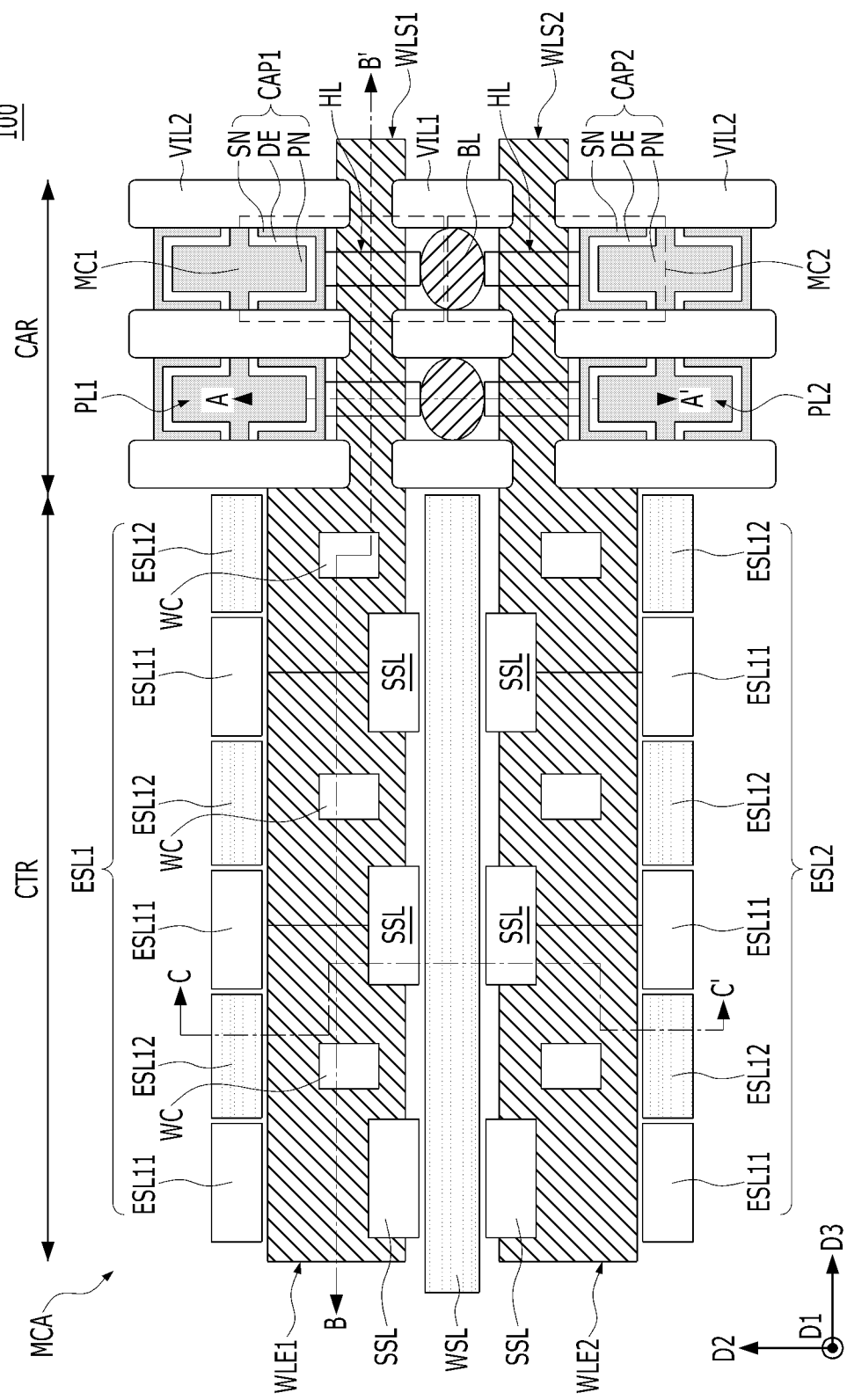
FIG. 1 is a schematic plan view of a semiconductor device according to an embodiment.

Embodiments described in this specification may be described with reference to cross-sectional views, plan views, and block diagrams which are ideal schematic diagrams of the present disclosure. Accordingly, these diagrams may be changed or modified by manufacturing technology requirements and/or tolerances. Accordingly, the embodiments of the present disclosure are not limited to the illustrated specific forms, but may also include a change in a form that is generated according to a manufacturing process. Accordingly, regions illustrated in the drawings have approximate attributes, and forms of the regions illustrated in the drawings are provided to illustrate specific forms of the areas of a device and are not intended to limit the scope of the present disclosure.

Figure 2A:
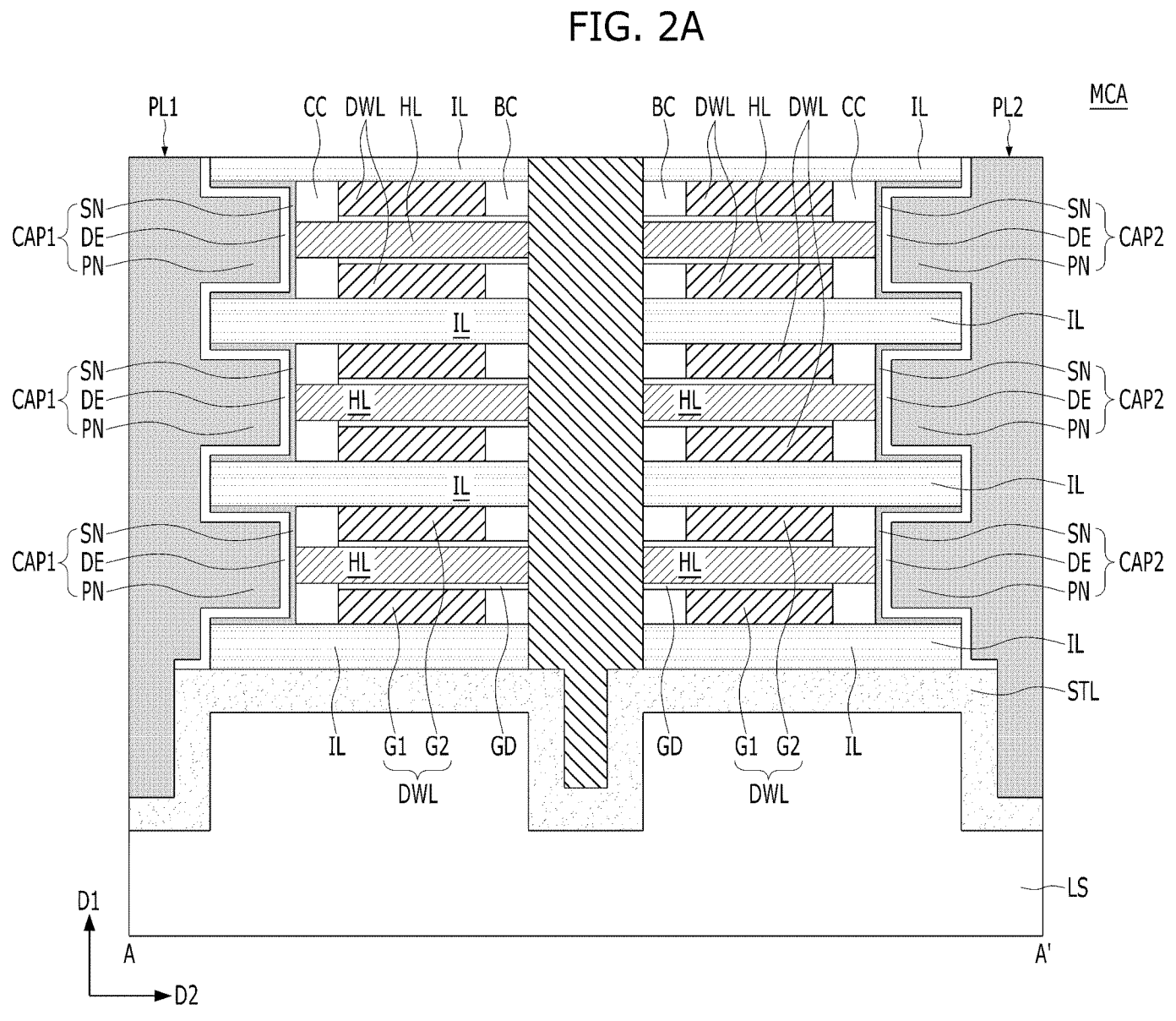
Figure 2B:
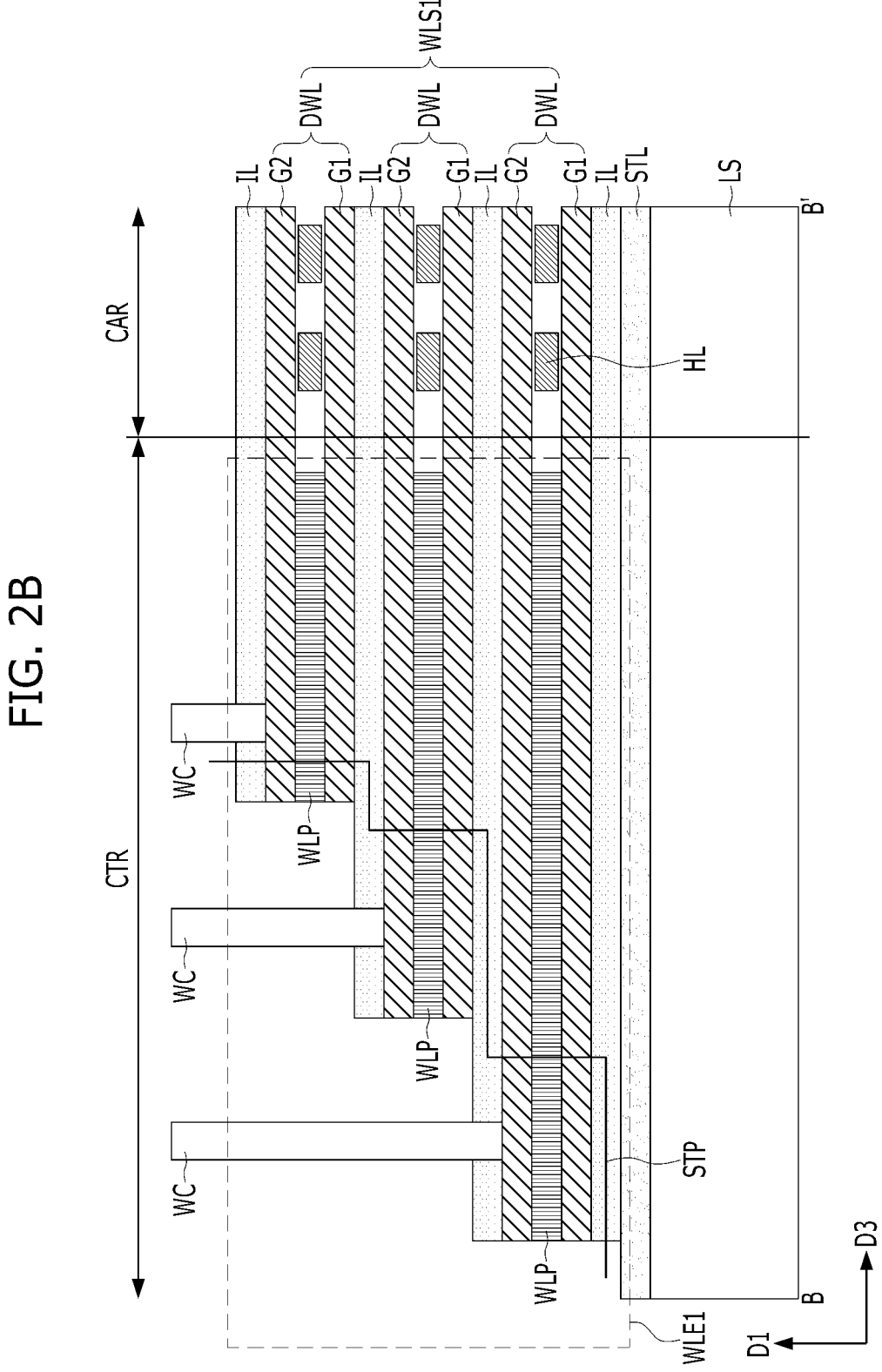
FIG. 2B is a cross-sectional view taken along line B-B' in FIG. 1.
Figure 2C:
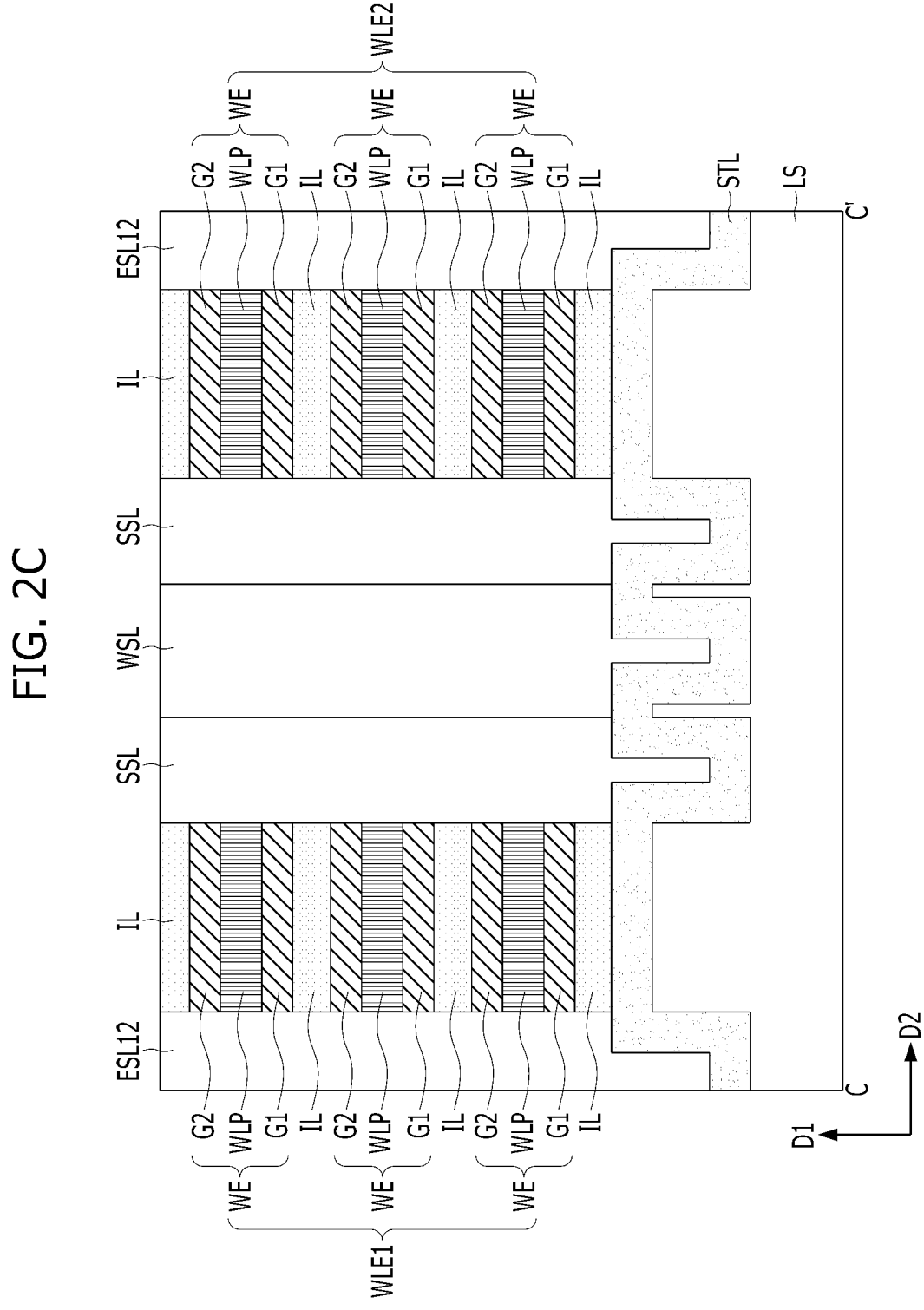
FIG. 2C is a cross-sectional view taken along line C-C' in FIG. 1.

FIG. 1 is a schematic plan view of a semiconductor device according to an embodiment. FIG. 2A is a cross-sectional view taken along line A-A' in FIG. 1. FIG. 2B is a cross-sectional view taken along line B-B' in FIG. 1. FIG. 2C is a cross-sectional view taken along line C-C' in FIG. 1.

Referring to FIGS. 1, 2A, 2B, and 2C, a semiconductor device 100 may include a lower structure LS, a memory cell array MCA, and a dielectric pad layer STL. The dielectric pad layer STL may be disposed between the lower structure LS and the memory cell array MCA.

The memory cell array MCA may include a first region CAR and a second region CTR. The first region CAR may be referred to as a cell array portion or a cell array region. The second region CTR may be referred to as a contact portion or a contact region. A first horizontal conductive line stack WLS1 and a second horizontal conductive line stack WLS2 may be disposed in the first region CAR. The first horizontal conductive line stack WLS1 and the second horizontal conductive line stack WLS2 may extend from the first region CAR to the second region CTR. The first horizontal conductive line stack WLS1 and the second horizontal conductive line stack WLS2 may include a first edge stack WLE1 and a second edge stack WLE2, respectively. An isolation slit WSL may be disposed in the second region CTR. The isolation slit WSL may be disposed between the first edge stack WLE1 and the second edge stack WLE2. The isolation slit WSL may be filled with a dielectric material including, for example, silicon oxide, silicon carbon oxide, silicon nitride, or a combination of silicon oxide, silicon carbon oxide, or silicon nitride.

A plurality of vertical conductive lines BL may be disposed in the first region CAR spaced apart from each other at a regular interval. The vertical conductive lines BL may be disposed between the first horizontal conductive line stack WLS1 and the second horizontal conductive line stack WLS2. The vertical conductive lines BL may extend in a first direction D1 perpendicular to a surface of the lower structure LS.

A plurality of data storage elements CAP1 and CAP2 may be disposed in the first region CAR. In an embodiment, the first and second horizontal conductive lines WLS1 and WLS2 and the vertical conductive lines BL may be disposed between the data storage elements CAP1 and CAP2 along a second direction D2. The data storage elements CAP1 and CAP2 may include first data storage elements CAP1 and second data storage elements CAP2. Each of the first and second data storage elements CAP1 and CAP2 may include a first electrode SN, a second electrode PN and a dielectric layer DE disposed therebetween. The first horizontal conductive line stack WLS1 may be disposed between the first data storage elements CAP1 and the vertical conductive lines BL in the second direction D2. The second horizontal conductive line stack WLS2 may be disposed between the second data storage elements CAP2 and the vertical conductive lines BL in the second direction D2. Each of the first and second data storage elements CAP1 and CAP2 may for example, include a memory element, such as a capacitor.

First vertical isolation layers VIL1 may be disposed between the vertical conductive lines BL in a third direction D3. Second vertical isolation layers VIL2 may be disposed between the data storage elements CAP1 and CAP2 in the third direction D3. The first and second vertical isolation layers VIL1 and VIL2 may extend vertically in the first direction D1. In an embodiment, the first and second vertical isolation layers VIL1 and VIL2 may extend laterally along the second direction D2 . . . . Each of the first and second vertical isolation layers VIL1 and VIL2 may include a dielectric material. Each of the first and second vertical isolation layers VIL1 and VIL2 may include, for example, silicon oxide, silicon carbon oxide, silicon nitride, or a combination of silicon oxide, silicon carbon oxide, or silicon nitride.

A plurality of first memory cells MC1 and a plurality of second memory cells MC2 may be disposed in the first region CAR. The first memory cells MC1 may share the first horizontal conductive line stack WLS1. The second memory cells MC2 may share the second horizontal conductive line stack WLS2. The first memory cells MC1 and the second memory cells MC2 may share the vertical conductive lines BL. In the present embodiment, the semiconductor device 100 may have a mirror type structure in which the vertical conductive lines BL are shared. The first memory cells MC1 may include the first data storage elements CAP1. The second memory cells MC2 may include the second data storage elements CAP2.

A plurality of supporting elements SSL may be disposed in the second region CTR. The supporting elements SSL may be adjacent to the isolation slit WSL. The supporting elements SSL may extend vertically in the first direction D1. The supporting elements SSL may include, for example, silicon oxide, silicon carbon oxide, silicon nitride, or a combination of silicon oxide, silicon carbon oxide, or silicon nitride.

The semiconductor device 100 may further include edge slits ESL1 and ESL2 that are disposed in the second region CTR. The first edge slit ESL1 may be adjacent to the first horizontal conductive line stack WLS1. The second edge slit ESL2 may be adjacent to the second horizontal conductive line stack WLS2. The isolation slit WSL may be disposed between the first edge slit ESL1 and the second edge slit ESL2. In an embodiment the isolation slit WSL may be disposed centrally between the first edge slit ESL1 and the second edge slit ESL2 in the second direction D2. The first edge stack WLE1 may be disposed between the first edge slit ESL1 and the isolation slit WSL. The second edge stack WLE2 may be disposed between the second edge slit ESL2 and the isolation slit WSL.

Each of the first edge slit ESL1 and the second edge slit ESL2 may include a plurality of first small slits ESL11 and a plurality of second small slits ESL12. The first and second small slits ESL11 and ESL12 may extend in the first direction D1. The first small slits ESL11 and the second small slits ESL12 may be alternately disposed in the third direction D3. The first and second small slits ESL11 and ESL12 may be pillar type slits.

The first edge slit ESL1 and the second edge slit ESL2 may include a dielectric material. The first edge slit ESL1 and the second edge slit ESL2 may include, for example, silicon oxide, silicon carbon oxide, silicon nitride, or a combination of silicon oxide, silicon carbon oxide, or silicon nitride.

Each of the first and second horizontal conductive line stacks WLS1 and WLS2 may include a plurality of horizontal conductive lines DWL. The horizontal conductive lines DWL may extend in their length dimension in the third direction D3. Each of the horizontal conductive lines DWL may have a double line structure. For example, each of the horizontal conductive lines DWL may include a pair of a first horizontal conductive line G1 and a second horizontal conductive line G2. Each of the first and second edge stacks WLE1 and WLE2 may include a plurality of edge horizontal conductive lines WE. The edge horizontal conductive lines WE of the first and second edge stacks WLE1 and WLE2 may be portions of the horizontal conductive lines DWL of the first and second horizontal conductive line stacks WLS1 and WLS2.

The edge horizontal conductive lines WE of the first and second edge stacks WLE1 and WLE2 may extend in the third direction D3. Each of the edge horizontal conductive lines WE of the first and second edge stacks WLE1 and WLE2 may have a double line structure. For example, each of the edge horizontal conductive lines WE may include a pair of a first horizontal conductive line G1 and a second horizontal conductive line G2.

Each of the first and second edge stacks WLE1 and WLE2 may include a stair type structure STP.

Each of the first and second edge stacks WLE1 and WLE2 may further include connection pads WLP. Each of the connection pads WLP may be disposed between the first horizontal conductive line G1 and second horizontal conductive line G2 of the edge horizontal conductive lines WE. The first horizontal conductive line G1 and the second horizontal conductive line G2 may be electrically coupled by the connection pad WLP.

A plurality of contact plugs WC may be disposed in the second region CTR. The contact plugs WC may be coupled to the first and second edge stacks WLE1 and WLE2. For example, the contact plugs WC may be electrically coupled to the second horizontal conductive lines G2 of the edge horizontal conductive lines WE.

Horizontal level isolation layers IL may be disposed between the horizontal conductive lines DWL that are stacked in the first direction D1 in the first region CAR. The horizontal level isolation layers IL may extend in the third direction D3. Each of the horizontal level isolation layers IL may be disposed between the edge horizontal conductive lines WE that are stacked in the first direction D1 in the second region CTR. The horizontal level isolation layers IL may extend in the third direction D3. The horizontal level isolation layers IL may include, for example, silicon oxide.

Horizontal layers HL may be disposed between the first horizontal conductive line G1 and the second horizontal conductive line G2 in the first region CAR. Gate dielectric layers GD may be disposed between the horizontal layers HL and the first and second horizontal conductive lines G1 and G2.

One sides of the horizontal layers HL may be coupled to the vertical conductive line BL. The other sides of the horizontal layers HL may be coupled to the data storage elements CAP1 and CAP2, respectively.

The horizontal layer HL and the horizontal conductive line DWL may constitute a cell transistor.

The vertical conductive line BL may be vertically oriented in the first direction D1. The vertical conductive line BL may be denoted as a vertically-oriented bit line or a pillar type bit line. The vertical conductive line BL may include a conductive material. The vertical conductive line BL may include a silicon-base material, a metal-base material, or a combination of a silicon-base material or a metal-base material. The vertical conductive line BL may include silicon, metal, metal nitride, metal silicide, or a combination of silicon, metal, metal nitride, or metal silicide. The vertical conductive line BL may include polysilicon, titanium nitride, tungsten, or a combination of polysilicon, titanium nitride, or tungsten. For example, the vertical conductive line BL may include polysilicon doped with N type impurities or titanium nitride (TiN). The vertical conductive line BL may include a TiN/W stack that includes titanium nitride and tungsten on the titanium nitride.

The horizontal layers HL may include a semiconductor material or an oxide semiconductor material. For example, the horizontal layers HL may include monocrystalline silicon, germanium, silicon-germanium, or indium gallium zinc oxide (IGZO). In another embodiment, each of the horizontal layers HL may include a first source/drain region, a second source/drain region, and a channel between the first source/drain region and the second source/drain region. The first source/drain region and the second source/drain region may be doped with impurities having the same conductive type. The first source/drain region and the second source/drain region may be doped with N type impurities or may be doped with P type impurities. The first source/drain region and the second source/drain region may include at least any one impurity selected from arsenic (As), phosphorus (P), boron (B), indium (In), or a combination of arsenic (As), phosphorus (P), boron (B), or indium (In). The first source/drain region may be coupled to the vertical conductive line BL. The second source/drain region may be coupled to the data storage elements CAP1 and CAP2.

In the horizontal conductive line DWL, the first horizontal conductive line G1 and the second horizontal conductive line G2 may be applied with the same voltage.

The gate dielectric layer GD may include, for example, silicon oxide, silicon nitride, metal oxide, metal oxynitride, metal silicate, a high-k material, a ferroelectric material, an anti-ferroelectric material, or a combination of silicon oxide, silicon nitride, metal oxide, metal oxynitride, metal silicate, a high-k material, a ferroelectric material, or an anti-ferro-electric material. The gate dielectric layer GD may include $SiO_2$, $Si_3N_4$, $HfO_2$, $Al_2O_3$, $ZrO_2$, AlON, HfON, HfSiO, HfSiON, or HfZrO.

The first and second horizontal conductive lines G1 and G2 of the horizontal conductive line DWL may include metal, a metal mixture, a metal alloy, or a semiconductor material. The first and second horizontal conductive lines G1 and G2 may include titanium nitride, tungsten, polysilicon, or a combination of titanium nitride, tungsten, or polysilicon. For example, the first and second horizontal conductive lines G1 and G2 may include a TiN/W stack in which titanium nitride and tungsten are sequentially stacked. The first and second horizontal conductive lines G1 and G2 may include an N type work function material or a P type work function material. The N type work function material may have a low work function of 4.5 eV or less. The P type work function material may have a high work function of 4.5 eV or more. The horizontal conductive line DWL and the edge horizontal conductive line WE may be formed of the same material as an integrated type.

The first electrodes SN of the data storage elements CAP1 and CAP2 may have a cylinder shape in which the first electrodes have been horizontally oriented. The dielectric layer DE may be aligned with the inner wall and outer wall of the cylinder of each of the first electrodes SN. The second electrodes PN may be coupled to common plates PL1 and PL2. The second electrodes PN of the first data storage elements CAP1 may be coupled to the first common plate PL1 in common. The second electrodes PN of the second data storage elements CAP2 may be coupled to the second common plate PL1 in common.

The first and second electrodes SN and PN may include metal, precious metal, metal nitride, conductive metal oxide, conductive and precious metal oxide, metallic carbide, metal silicide, or a combination of metal, precious metal, metal nitride, conductive metal oxide, conductive precious metal oxide, metallic carbide, or metal silicide. For example, the first and second electrodes SN and PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack.

The dielectric layer DE may be a capacitor dielectric layer, and may include, for example, silicon oxide ($SiO_2$), silicon nitride, a high-k material, or a combination of silicon oxide, silicon nitride, or a high-k material, for example. The high-k material may have a higher dielectric constant than silicon oxide. Silicon oxide ($SiO_2$) may have a dielectric constant of about 3.9. The dielectric layer DE may include a high-k material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a complex layer including two or more layers of the aforementioned high-k material.

The dielectric layer DE may be formed of zirconium (Zr)-base oxide. The dielectric layer DE may have a stack structure including at least zirconium oxide ($ZrO_2$). The dielectric layer DE may include a $ZrO_2/Al_2O_3$ (ZA) stack or a $ZrO_2/Al_2O_3/ZrO_2$ (ZAZ) stack. The ZA stack may be a structure in which aluminum oxide ($Al_2O_3$) has been stacked on zirconium oxide ($ZrO_2$). The ZAZ stack may be a structure in which zirconium oxide ($ZrO_2$), aluminum oxide ($Al_2O_3$), and zirconium oxide ($ZrO_2$) have been sequentially stacked. Each of the ZA stack and ZAZ stack may be denoted as a zirconium oxide ($ZrO_2$)-base layer. In another embodiment, the dielectric layer DE may be formed of hafnium (Hf)-base oxide. The dielectric layer DE may have a stack structure including at least hafnium oxide ($HfO_2$). The dielectric layer DE may include a $HfO_2/Al_2O_3$ (HA) stack or a $HfO_2/Al_2O_3/HfO_2$ (HAH) stack. The HA stack may have a structure in which aluminum oxide ($Al_2O_3$) has been stacked on hafnium oxide ($HfO_2$). The HAH stack may have a structure in which hafnium oxide ($HfO_2$), aluminum oxide ($Al_2O_3$), and hafnium oxide ($HfO_2$) have been sequentially stacked. Each of the HA stack and HAH stack may be denoted as a hafnium oxide ($HfO_2$)-base layer. In the ZA stack, the ZAZ stack, the HA stack, and the HAH stack, aluminum oxide ($Al_2O_3$) may have greater bandgap energy (hereinafter referred to as a "bandgap") than each of zirconium oxide ($ZrO_2$) and hafnium oxide ($HfO_2$). Aluminum oxide ($Al_2O_3$) may have a lower dielectric constant than each of zirconium oxide ($ZrO_2$) and hafnium oxide ($HfO_2$). Accordingly, the dielectric layer DE may include a stack including a high-k material and a high bandgap material having a greater bandgap than the high-k material. The dielectric layer DE may also include silicon oxide ($SiO_2$) as another high bandgap material in addition to aluminum oxide ($Al_2O_3$). The leakage current can be suppressed because the dielectric layer DE includes a high bandgap material. The high bandgap material may be thinner than the high-k material. In another embodiment, the dielectric layer DE may have a laminated structure in which a high-k material and a high bandgap material have been alternately stacked. For example, the dielectric layer DE may include a $ZrO_2/Al_2O_3/ZrO_2/Al_2O_3$ (ZAZA) stack, a $ZrO_2/Al_2O_3/ZrO_2/Al_2O_3/ZrO_2$ (ZAZAZ) stack, an $HfO_2/Al_2O_3/HfO_2/Al_2O_3$ (HAH) stack, or an $HfO_2/Al_2O_3/HfO_2/Al_2O_3/HfO_2$ (HAHAH) stack. The laminated structure, aluminum oxide ($Al_2O_3$) may be thinner than each of zirconium oxide ($ZrO_2$) and hafnium oxide ($HfO_2$).

In another embodiment, the dielectric layer DE may include a stack structure, a laminated structure, or a mutual mixing structure that includes zirconium oxide, hafnium oxide, and aluminum oxide.

In another embodiment, the dielectric layer DE may include a ferroelectric material or a semi-ferroelectric material.

In another embodiment, an interface control layer for improving the leakage current may be further formed between the first electrodes SN and the dielectric layer DE. The interface control layer may include titanium oxide ($TiO_2$), niobium oxide, or niobium nitride. The interface control layer may also be formed between the second electrodes PN and the dielectric layer DE.

Each of the data storage elements CAP1 and CAP2 may include a metal-insulator-metal (MIM) capacitor.

Each of the data storage elements CAP1 and CAP2 may be substituted with a data storage material other than a capacitor. For example, the data storage material may be a phase change material, a magnetic tunnel junction (MTJ), or a variable resistance material.

The dielectric pad layer STL may cover the surface of the lower structure LS. The lower structure LS may include a semiconductor substrate. The dielectric pad layer STL may include a dielectric material. The dielectric pad layer STL may include, for example, silicon oxide. The vertical conductive lines BL may come into contact with the dielectric pad layer STL. The first and second common plates PL1 and PL2 may come into contact with the dielectric pad layer STL. The isolation slit WSL, the supporting elements SSL, and the edge slits ESL1 and ESL2 may come into contact with the dielectric pad layer STL. As will be described later, the dielectric pad layer STL can prevent a conductive material from being formed on the surface of the lower structure LS.

The dielectric pad layer STL may be formed, for example, by a deposition process or an oxidation process. The dielectric pad layer STL may include, for example, silicon oxide, SiCO, SiCN, SiCON, or a combination of silicon oxide, SiCO, SiCN, or SiCON.

FIGS. 3 to 18 are diagrams for describing an example of a method of manufacturing a semiconductor device according to certain embodiments.

Figure 3:
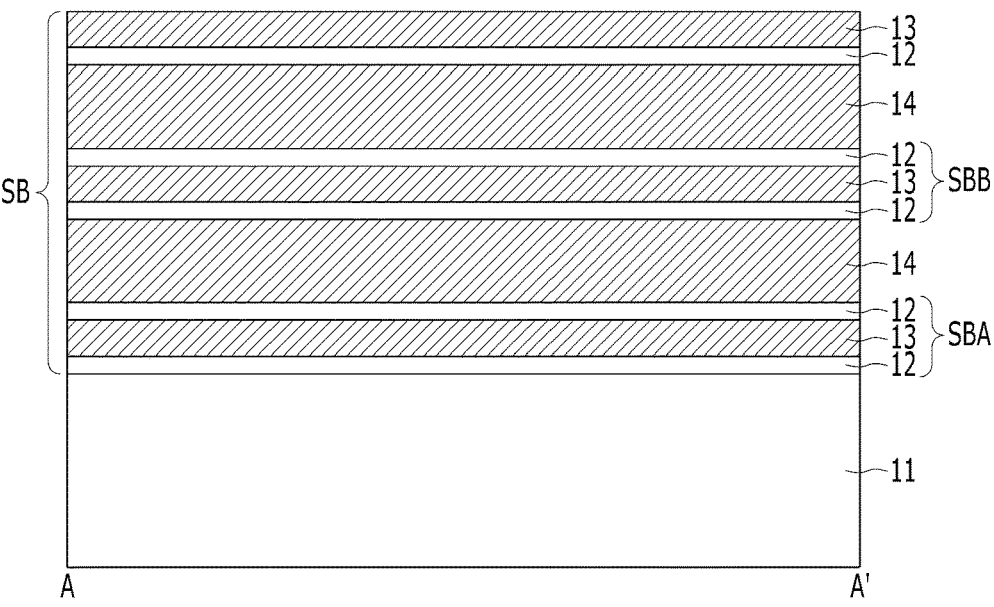
FIGS. 3 to 17 are diagrams illustrating a method of manufacturing a semiconductor device according to an embodiment.

As illustrated in FIG. 3, a stack body SB may be formed on a lower structure 11. The lower structure 11 may include a semiconductor substrate. The lower structure 11 may include, for example, a silicon substrate.

The stack body SB may include a plurality of sacrificial semiconductor layers 12, a plurality of first semiconductor layers 13, and a plurality of second semiconductor layers 14. In order to form the stack body SB, the sacrificial semiconductor layer 12, the first semiconductor layer 13, the sacrificial semiconductor layer 12, and the second semiconductor layer 14 may be alternately formed. The sacrificial semiconductor layer 12 may be disposed at the highest level of the stack body SB.

Each of the first semiconductor layers 13 may be thinner than each of the second semiconductor layers 14. Each of the second semiconductor layers 14 may have a thickness that is about 2 to 3 times each of the first semiconductor layers 13. For example, each of the first semiconductor layers 13 may have a thickness of 1 to 20 nm. Each of the second semiconductor layers 14 may have a thickness of 1 to 40 nm. Each of the sacrificial semiconductor layers 12 may be thinner than each of the first and second semiconductor layers 13 and 14. Each of the sacrificial semiconductor layers 12 may be thinner than each of the first semiconductor layers 13. For example, each of the sacrificial semiconductor layers 12 may have a thickness of 1 to 10 nm. The sacrificial semiconductor layer 12 at the highest level of the stack body SB may be disposed on the second semiconductor layer 14 having the highest level, among the first and second semiconductor layers 13 and 14. In another embodiment, the sacrificial semiconductor layer 12 at the highest level may be omitted.

In another embodiment, the order of the first semiconductor layers 13 and the second semiconductor layers 14 may be changed and formed. That is, each of the first semiconductor layers 13 may be thicker than each of the second semiconductor layers 14. Each of the first semiconductor layers 13 may have a thickness that is about 2 to 3 times each of the second semiconductor layers 14. For example, each of the first semiconductor layers 13 may have a thickness of about 40 nm. Each of the second semiconductor layers 14 may have a thickness of about 20 nm.

Each of the sacrificial semiconductor layers 12, the first semiconductor layers 13, and the second semiconductor layers 14 that constitute the stack body SB may be formed by an epitaxial growth process. The sacrificial semiconductor layers 12, the first semiconductor layers 13, and the second semiconductor layers 14 may include a monocrystalline semiconductor material. The first and second semiconductor layers 13 and 14 may include a first semiconductor material that is selected among monocrystalline silicon and monocrystalline silicon germanium. The sacrificial semiconductor layers 12 may include a second semiconductor material different from the first semiconductor material. For example, each of the first and second semiconductor layers 13 and 14 may be a monocrystalline silicon layer. Each of the sacrificial semiconductor layers 12 may be a monocrystalline silicon germanium layer.

As described above, in order to form the stack body SB, epitaxial growth may be used. The stack body SB may be formed by repeating a plurality of sub-stacks. An individual sub-stack may be stacked in order of the sacrificial semiconductor layer 12, the first semiconductor layer 13, the sacrificial semiconductor layer 12, and the second semiconductor layer 14. If each of the first semiconductor layer 13 and the second semiconductor layer 14 includes a monocrystalline silicon layer and the sacrificial semiconductor layer 12 includes a monocrystalline silicon germanium layer, the individual sub-stack may be stacked in order of a first monocrystalline silicon germanium layer, a first monocrystalline silicon layer, a second monocrystalline silicon germanium layer, and a second monocrystalline silicon layer. In the individual sub-stack, the first monocrystalline silicon layer may be thinner than the second monocrystalline silicon layer. The first monocrystalline silicon germanium layer and the second monocrystalline silicon germanium layer may have the same thickness. Each of the first monocrystalline silicon germanium layer and the second monocrystalline silicon germanium layer may be thinner than the first monocrystalline silicon layer.

The stack body SB may include a first sacrificial layer structure SBA, the second semiconductor layer 14, and a second sacrificial layer structure SBB. The first sacrificial layer structure SBA may be disposed under the second semiconductor layer 14. The second sacrificial layer structure SBB may be disposed on the second semiconductor layer 14. Each of the first and second sacrificial layer structures SBA and SBB may be a tri-layered stack of the sacrificial semiconductor layer 12/the first semiconductor layer 13/the sacrificial semiconductor layer 12. For example, if the sacrificial semiconductor layer 12 includes a silicon germanium layer and the first semiconductor layer 13 includes a monocrystalline silicon layer, the tri-layered stack of each of the first and second sacrificial layer structures SBA and SBB may include a first silicon germanium layer/ monocrystalline silicon layer/second silicon germanium layer (SiGe/Si/SiGe) stack.

The first semiconductor layer 13 may include a first monocrystalline silicon layer. The second semiconductor layer 14 may include a second monocrystalline silicon layer. Accordingly, in the stack body SB, the first sacrificial layer structure SBA may be disposed under the second monocrystalline silicon layer. The second sacrificial layer structure SBB may be disposed on the second monocrystalline silicon layer. Each of the first and second sacrificial layer structures SBA and SBB may include a first silicon germanium layer/ first monocrystalline silicon layer/second silicon germanium layer stack. The second monocrystalline silicon layer may be thicker than the first monocrystalline silicon layer.

As reference has been made to the aforementioned embodiments, if memory cells are stacked, the stack body SB may be stacked several times.

Figure 4:
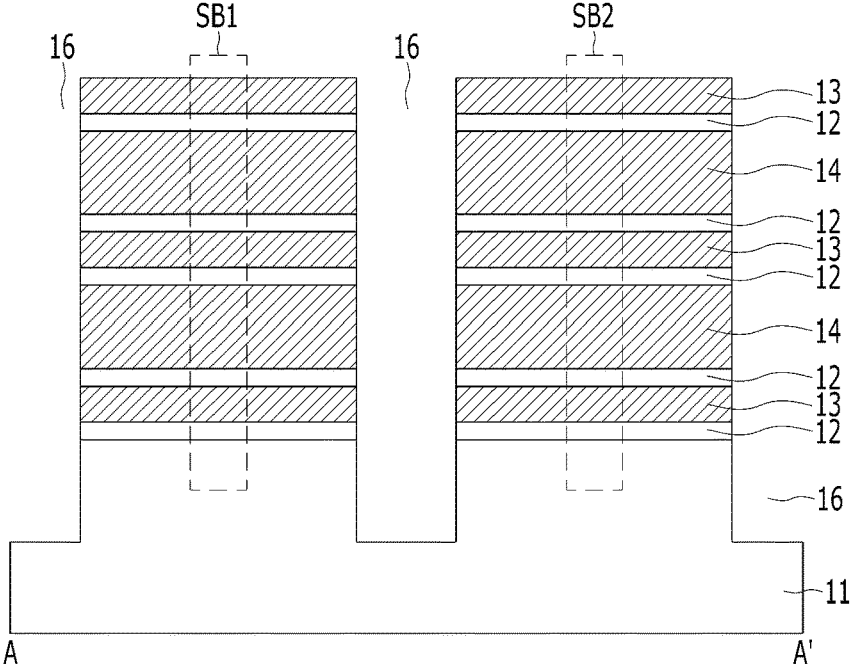

As illustrated in FIG. 4, first openings 16 may be formed in the stack body SB. The first openings 16 may vertically penetrate the stack body SB. In order to form the first openings 16, the stack body SB may be etched. A transversal cross section of each of the first openings 16 may have a hole shape. The first openings 16 may extend vertically in a direction in which the stack bodies SB have been stacked. The stack body SB may be divided into a first stack body SB1 and a second stack body SB2 by the first openings 16.

Figure 5:
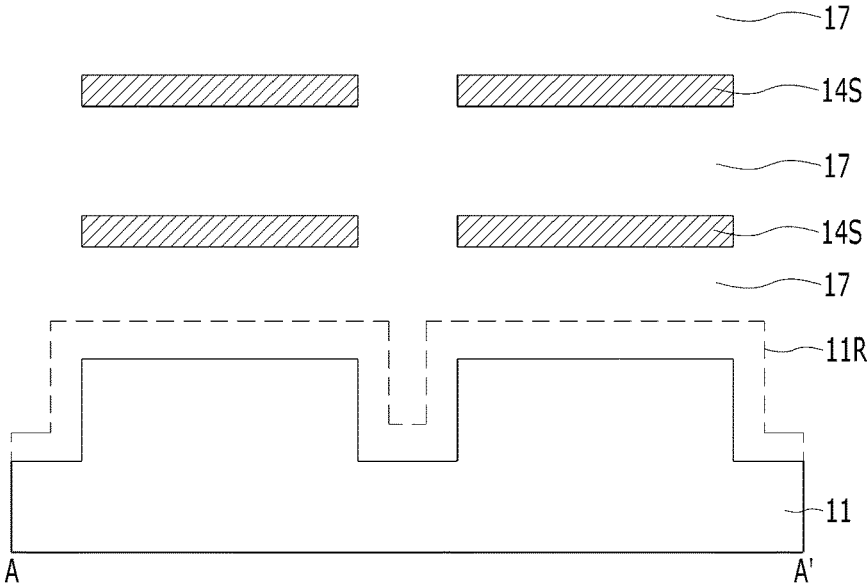

As illustrated in FIG. 5, a strip process and a plurality of recess processes may be performed through the first openings 16. For example, the strip process and the plurality of recess processes may include a step of stripping the sacrificial semiconductor layers 12, a step of recessing the first semiconductor layers 13, and a step of recessing the second semiconductor layers 14. Horizontal layers 14S may be formed by a process of recessing the second semiconductor layers 14. Horizontal recesses 17 may be formed by a process of stripping the sacrificial semiconductor layers 12 and a process of recessing the first semiconductor layers 13.

In order to selectively strip the sacrificial semiconductor layers 12, a difference between the etch selectivities of the first and second semiconductor layers 13 and 14 and the sacrificial semiconductor layers 12 may be used. In order to selectively strip the sacrificial semiconductor layers 12, wet etch or dry etch may be used. For example, if each of the sacrificial semiconductor layers 12 include a silicon germanium layer and each of the first and second semiconductor layers 13 and 14 includes silicon, silicon germanium layers may be etched by using an etchant or an etch gas that has selectivity to silicon layers.

In order to recess the first semiconductor layers 13, the first semiconductor layers 13 may be etched by using wet etch or dry etch. In one embodiment, the second semiconductor layers 14 may be partially etched until the first semiconductor layers 13 are removed. Accordingly, the first semiconductor layers 13 are removed, and the second semiconductor layers 14 are thinned. The process of recessing the first and second semiconductor layers 13 and 14 may be denoted as a process of thinning the second semiconductor layers 14. The thinned second semiconductor layers 14 may become the horizontal layers 14S. Each of the horizontal layers 14S may be denoted as a thin-semiconductor layer pattern, a thin-horizontal layer, or a thin-body active layer.

Each of the horizontal layers 14S may include a monocrystalline silicon layer. The surface of the lower structure 11 may be recessed (refer to reference numeral 11R) at a given depth while the first semiconductor layers 13 are removed.

The plurality of horizontal recesses 17 may be formed between the horizontal layers 14S. Each of the horizontal recesses 17 may be a space from which each of the first semiconductor layers 13 and each of the sacrificial semiconductor layers 12 have been removed.

Figure 6:
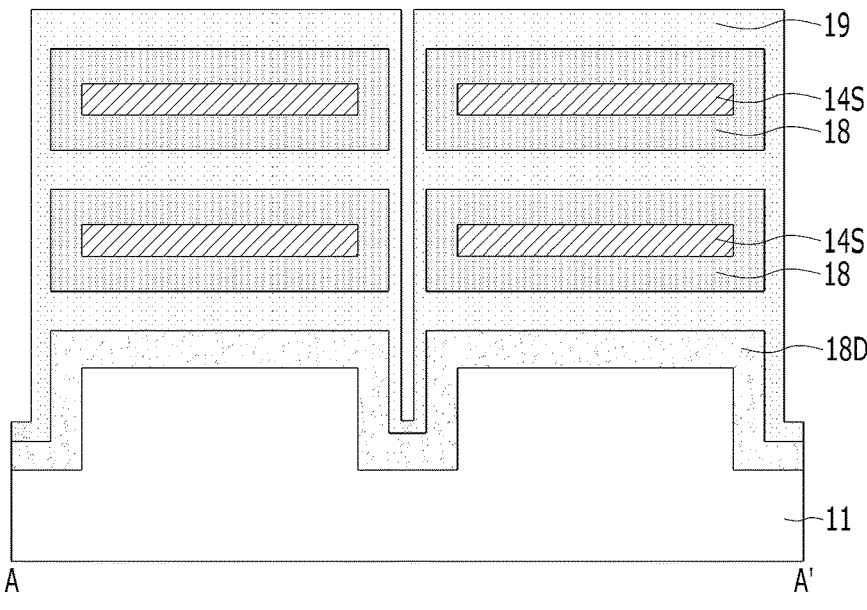

As illustrated in FIG. 6, the horizontal recesses 17 may be filled with dielectric materials. The dielectric materials may include sacrificial dielectric layers 18 and a cell isolation layer 19. First, the plurality of sacrificial dielectric layers 18 may be formed to cover the horizontal layers 14S. Subsequently, the cell isolation layer 19 may be formed on the sacrificial dielectric layers 18. The horizontal layers 14S and the sacrificial dielectric layers 18 may come into direct contact with each other. The sacrificial dielectric layers 18 may surround the corresponding horizontal layers 14S. The sacrificial dielectric layers 18 and the cell isolation layer 19 may be different materials. The sacrificial dielectric layers 18 may include silicon nitride. The cell isolation layer 19 may include, for example, silicon oxide.

While the sacrificial dielectric layers 18 are formed, a dummy sacrificial layer 18D that covers the surface of the lower structure 11 may be formed. The sacrificial dielectric layers 18 and the dummy sacrificial layer 18D may include the same material. The dummy sacrificial layer 18D may include silicon nitride.

As described above, referring to FIGS. 3 to 6, the first semiconductor layers 13 and sacrificial semiconductor layers 12 of the stack body SB may be substituted with the sacrificial dielectric layers 18 and the cell isolation layer 19, respectively. The second semiconductor layers 14 may become thin as the horizontal layers 14S.

Figure 7:
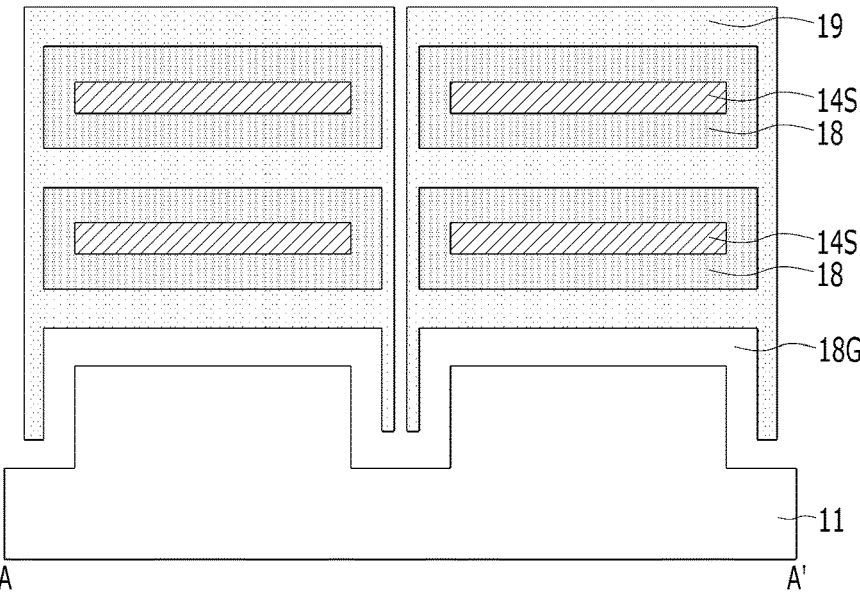

As illustrated in FIG. 7, portions of the cell isolation layer 19 may be etched so that the dummy sacrificial layer 18D is exposed.

Next, in order to form an air gap 18G between the cell isolation layer 19 and the lower structure 11, the dummy sacrificial layer 18D may be selectively removed. Since the sacrificial dielectric layers 18 are covered by the cell isolation layer 19, the sacrificial dielectric layers 18 may not be lost while the dummy sacrificial layer 18D is removed.

Figure 8:
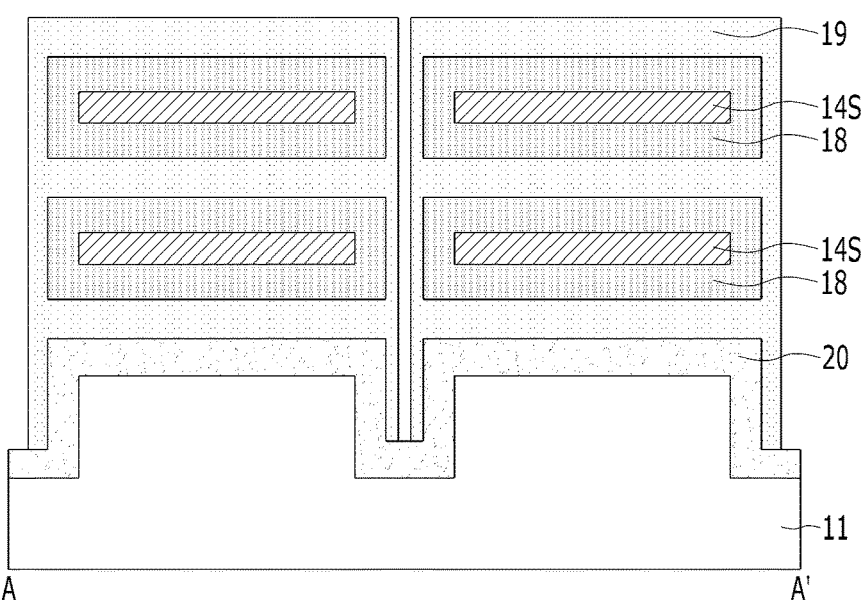

As illustrated in FIG. 8, a dielectric pad layer 20 that fills the air gap 18G may be formed. The dielectric pad layer 20 may include a dielectric material. The dielectric pad layer 20 and the cell isolation layer 19 may include the same material. The dielectric pad layer 20 and the sacrificial dielectric layers 18 may include different materials. The dielectric pad layer 20 may include, for example, silicon oxide. The dielectric pad layer 20 may be formed, for example, by a deposition process or an oxidation process. The dielectric pad layer 20 may cover the surface of the lower structure 11. The dielectric pad layer 20 may be formed by dry oxidation or wet oxidation. The dielectric pad layer 20 may include, for example, silicon oxide, SiCO, SiCN, SiCON, or a combination of silicon oxide, SiCO, SiCN, or SiCON.

Figure 9:
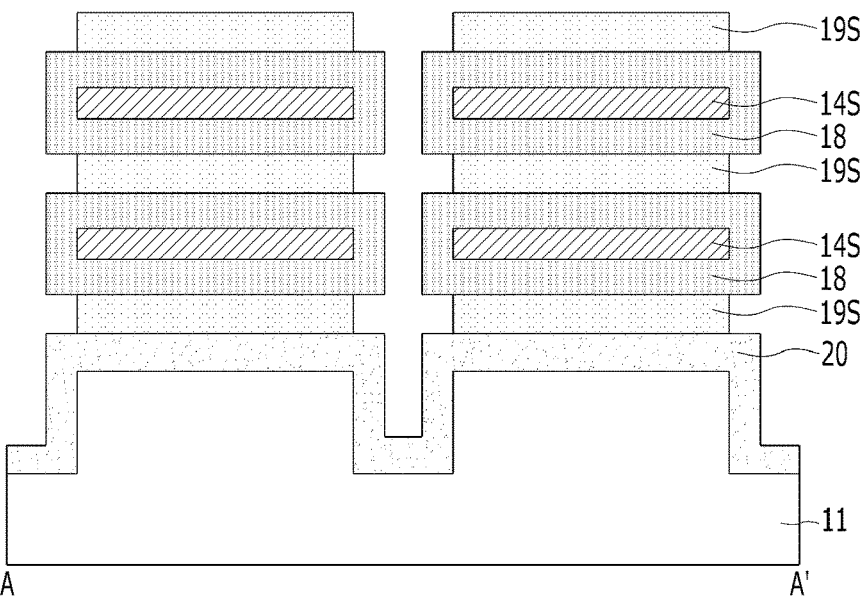

As illustrated in FIG. 9, in order to form cell isolation patterns 19S, a process of cutting the cell isolation layer 19 may be performed.

Figure 10:
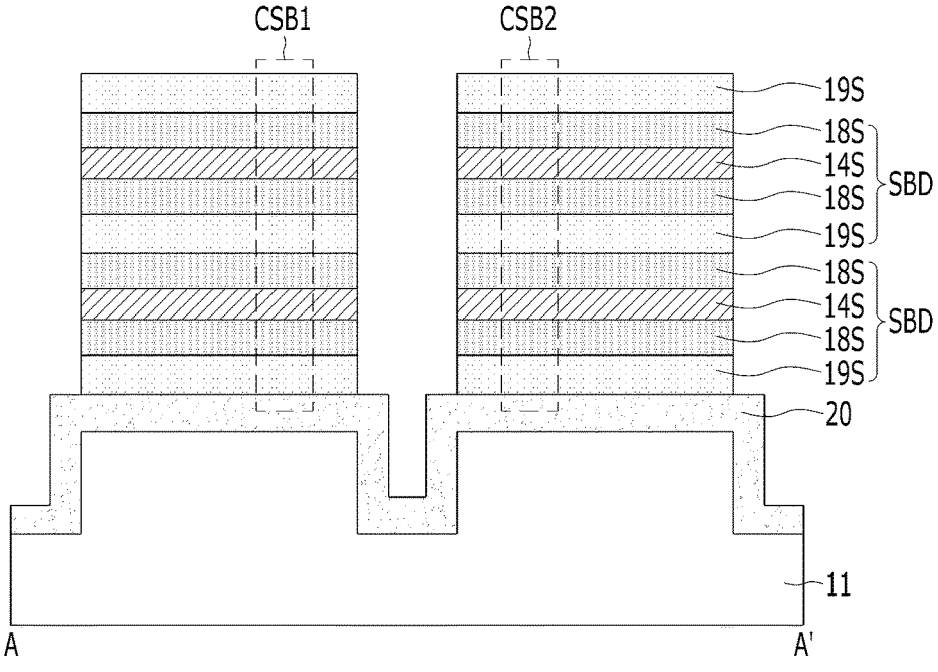

As illustrated in FIG. 10, in order to form sacrificial patterns 18S, a process of cutting the sacrificial dielectric layers 18 may be performed.

Referring to FIGS. 9 and 10, a plurality of cell stacks CSB1 and CSB2 may be formed over the dielectric pad layer 20. Each of the cell stacks CSB1 and CSB2 may include the horizontal layers 14S, the cell isolation patterns 19S, and the sacrificial patterns 18S. Each of the cell stacks CSB1 and CSB2 may include sub-cell stacks SBD. An individual sub-cell stack SBD may be stacked in order of the cell isolation pattern 19S, the sacrificial pattern 18S, the horizontal layer 14S, and the sacrificial pattern 18S.

Figure 11:
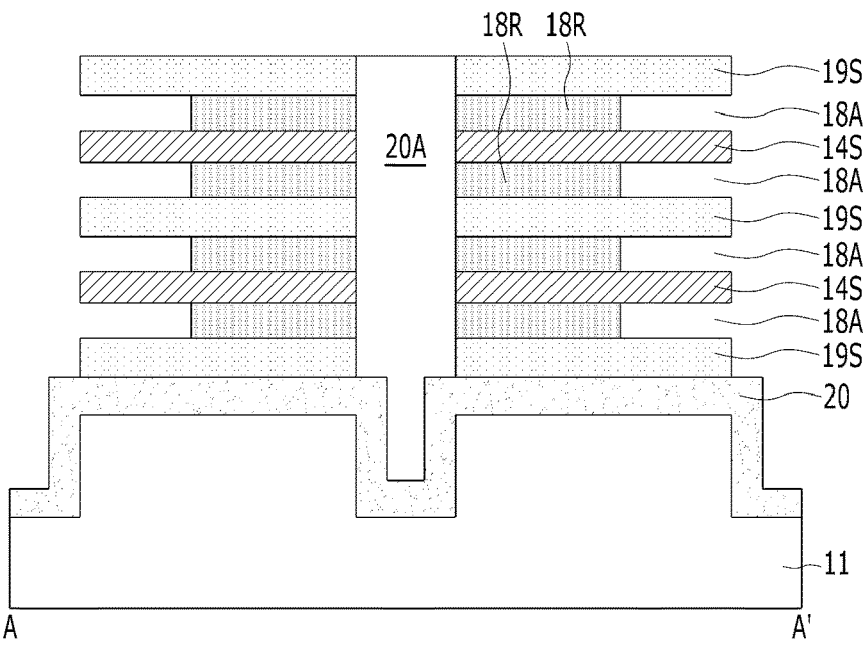

As illustrated in FIG. 11, a first sacrificial pillar 20A may be formed between the first cell stack CSB1 and the second cell stack CSB2. The first sacrificial pillar 20A may include, for example, silicon oxide, silicon nitride, or a combination of silicon oxide or silicon nitride.

Next, in order to form sacrificial recesses 18A, the sacrificial patterns 18S of the first and second cell stacks CSB1 and CSB2 may be recessed. The sacrificial recesses 18A may expose some surfaces of the horizontal layers 14S. After the sacrificial recesses 18A are formed, the sacrificial patterns 18S may remain like reference numeral 18R.

Figure 12:
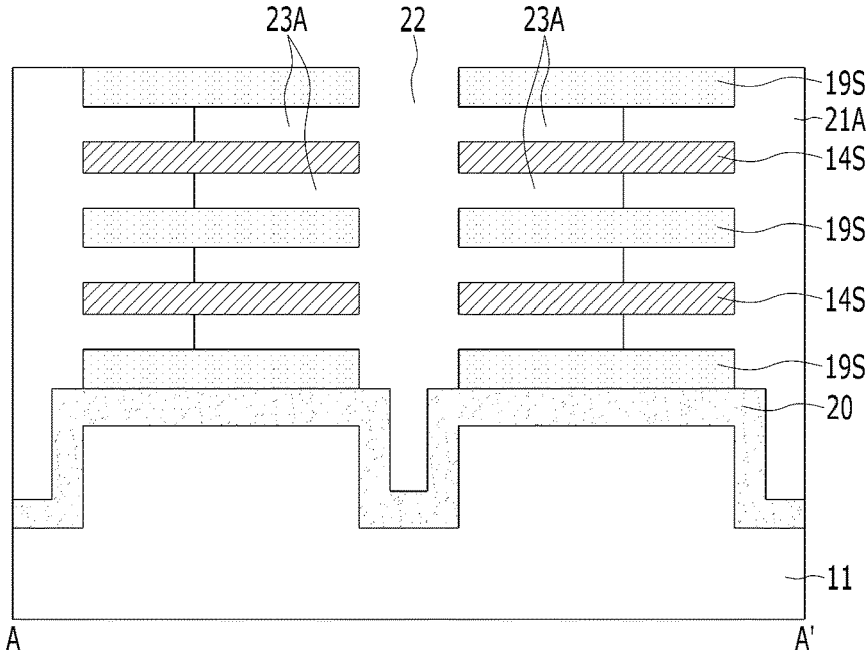

As illustrated in FIG. 12, second sacrificial pillars 21A that fill the sacrificial recesses 18A may be formed. The second sacrificial pillars 21A may include, for example, silicon oxide, silicon nitride, or a combination of silicon oxide or silicon nitride. The second sacrificial pillars 21A may cover some surfaces of the horizontal layers 14S.

Subsequently, the first sacrificial pillar 20A may be removed so that the first vertical opening 22 is formed. Next, in order to form horizontal recesses 23A, the sacrificial patterns 18R may be removed through a first vertical opening 22. The horizontal recesses 23A may expose some surfaces of the horizontal layers 14S.

Figure 13:
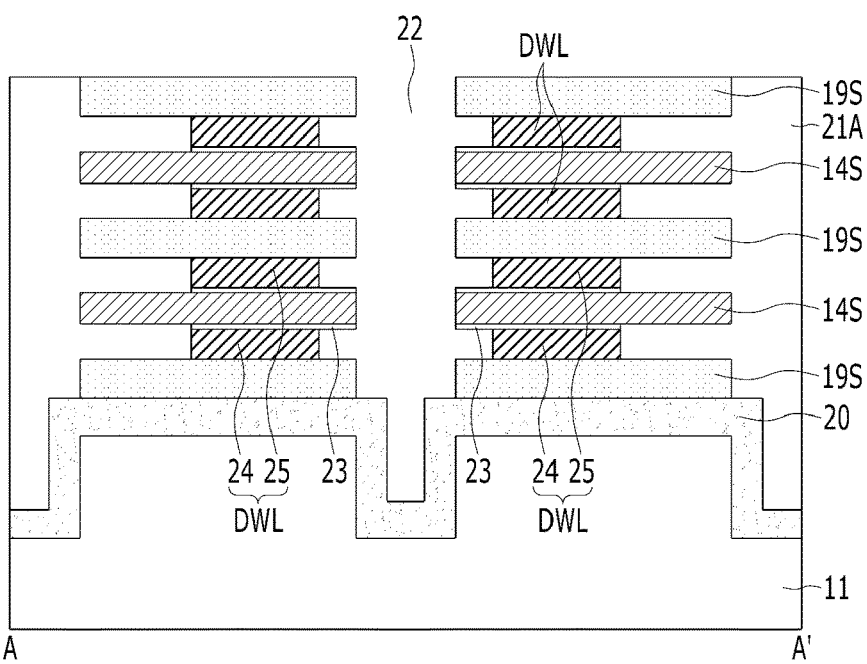

As illustrated in FIG. 13, a gate dielectric layer 23 may be formed on the exposed surfaces of the horizontal layers 14S. Horizontal conductive lines DWL that fill the horizontal recesses 23A may be formed on the gate dielectric layers 23. Each of the horizontal conductive lines DWL may include a pair of a first horizontal conductive line 24 and a second horizontal conductive line 25.

Figure 14:
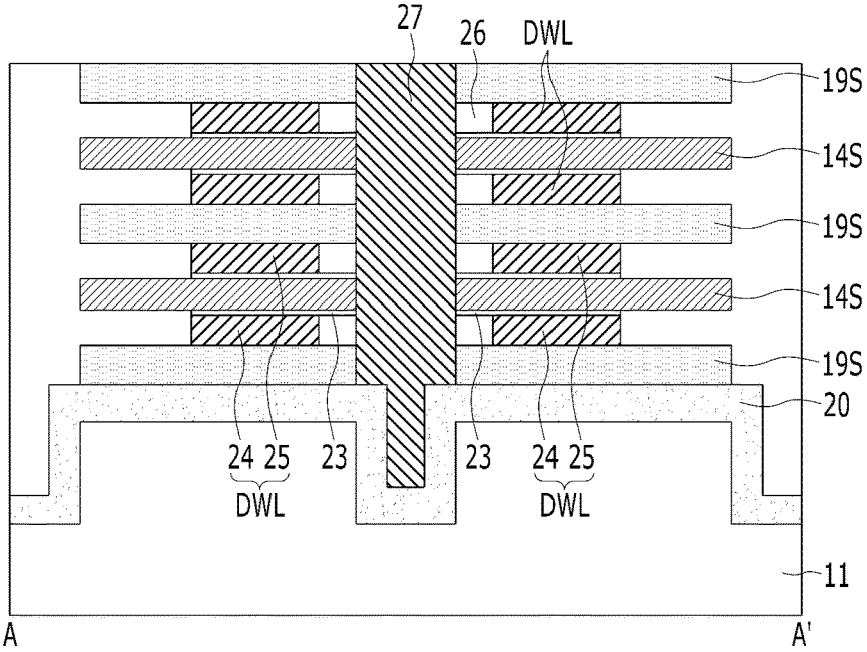

As illustrated in FIG. 14, a vertical conductive line 27 that fills the first vertical opening 22 may be formed. Before the vertical conductive line 27 is formed, first capping layers 26 that come into contact with the sidewalls of the horizontal conductive lines DWL may be formed. The first capping layers 26 may be disposed between the vertical conductive line 27 and the horizontal conductive lines DWL.

Figure 15:
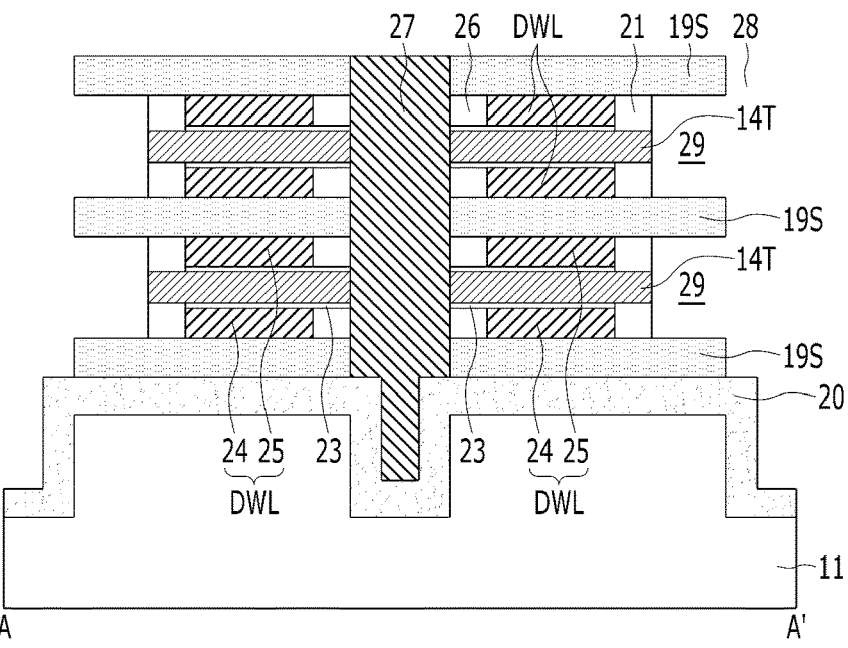

As illustrated in FIG. 15, in order to form second vertical openings 28, a process of recessing the second sacrificial pillar 21A may be performed. Second capping layers 21 may be formed by the process of recessing the second sacrificial pillar 21A. The second capping layers 21 may come into contact with the sidewalls of the other sides of the horizontal conductive lines DWL. After the second capping layers 21 are formed, a process of recessing the horizontal layers 14S may be performed. Accordingly, horizontal layer patterns 14T may be formed.

Wide openings 29 may be formed between the cell isolation patterns 19S by the recess processes for forming the second capping layers 21 and the horizontal layer patterns 14T.

Figure 16:
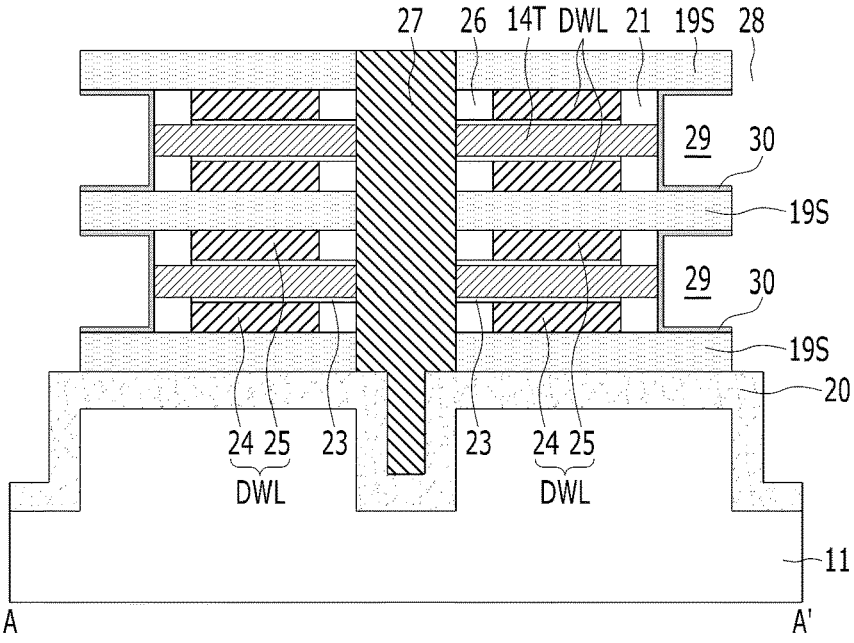

As illustrated in FIG. 16, first electrodes 30 of data storage elements may be formed within the wide openings 29, respectively. Each of the first electrodes 30 may have a cylinder shape. In order to form the first electrodes 30, the deposition of a conductive material and an etch-back process may be performed. The first electrodes 30 may be electrically coupled to the horizontal layer patterns 14T. The cell isolation patterns 19S may be disposed between the first electrodes 30 that are vertically stacked.

Figure 17:
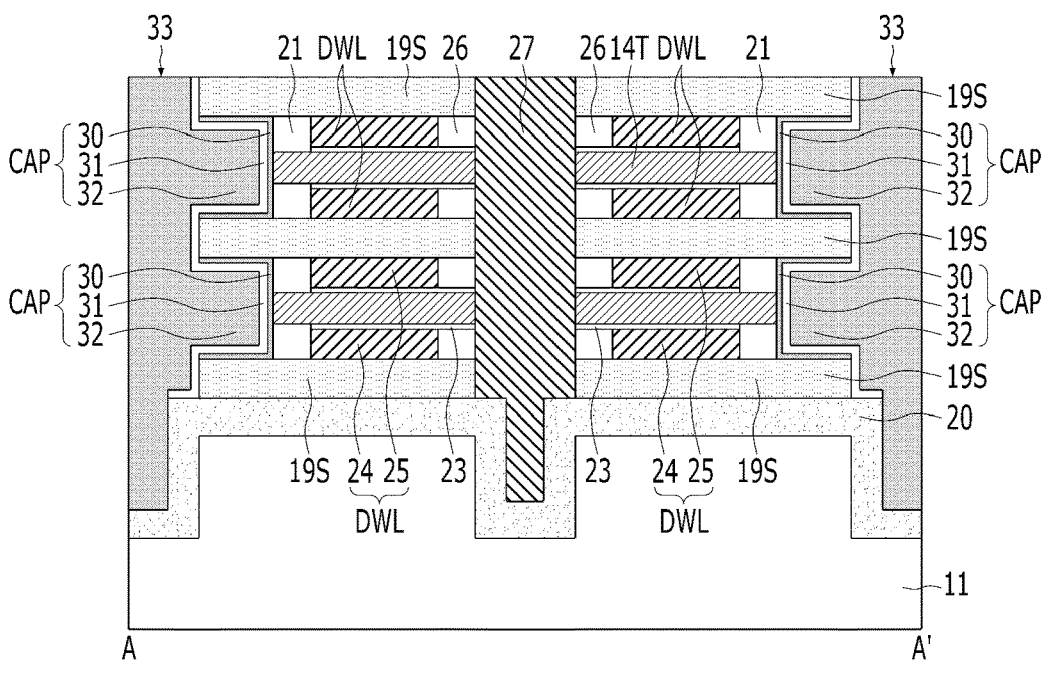

As illustrated in FIG. 17, a dielectric layer 31 of a data storage element may be formed on the first electrodes 30. Second electrodes 32 of data storage elements may be formed on the dielectric layer 31.

Data storage elements CAP may be formed by a series of the aforementioned processes. Each of the data storage elements CAP may include the first electrode 30, the dielectric layer 31, and the second electrode 32. The second electrodes 32 of the data storage elements CAP may constitute a common plate 33.

Figure 18:
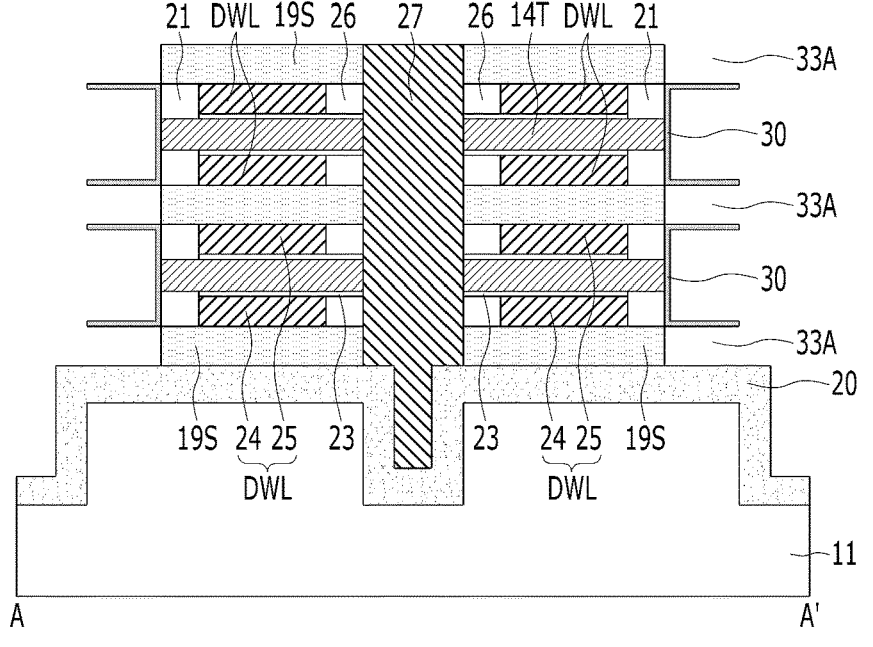
FIGS. 18 and 19 are diagrams illustrating a method of manufacturing a semiconductor device according to another embodiment of the present invention.
Figure 19:
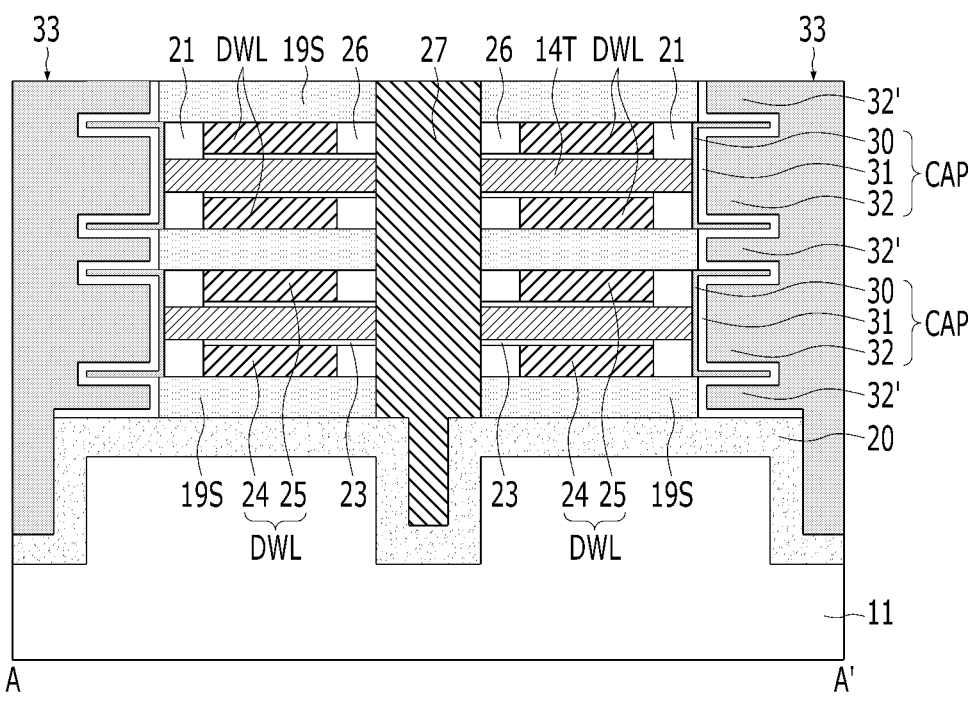

FIGS. 18 and 19 are diagrams illustrating a method of manufacturing a semiconductor device according to another embodiment of the present invention.

Referring to FIG. 18, after the first electrodes 30 are formed in FIG. 16, a process of recessing the cell isolation patterns 19S may be performed. After the process of recessing the cell isolation patterns, each of narrow gaps 33A may be formed between the first electrodes 30.

Referring to FIG. 19, the dielectric layer 31 of a data storage element may be formed on the narrow gaps 33A and the first electrodes 30. The second electrodes 32 of data storage elements may be formed on the dielectric layer 31.

The data storage elements CAP may be formed by a series of the aforementioned processes. Each of the data storage elements CAP may include the first electrode 30, the dielectric layer 31, and the second electrode 32. The data storage elements CAP may include outer nodes 32' that fill the narrow gaps while being coupled to the second electrodes 32. The second electrodes 32 of the data storage elements CAP and the outer nodes 32' may constitute the common plate 33.

Figure 20:
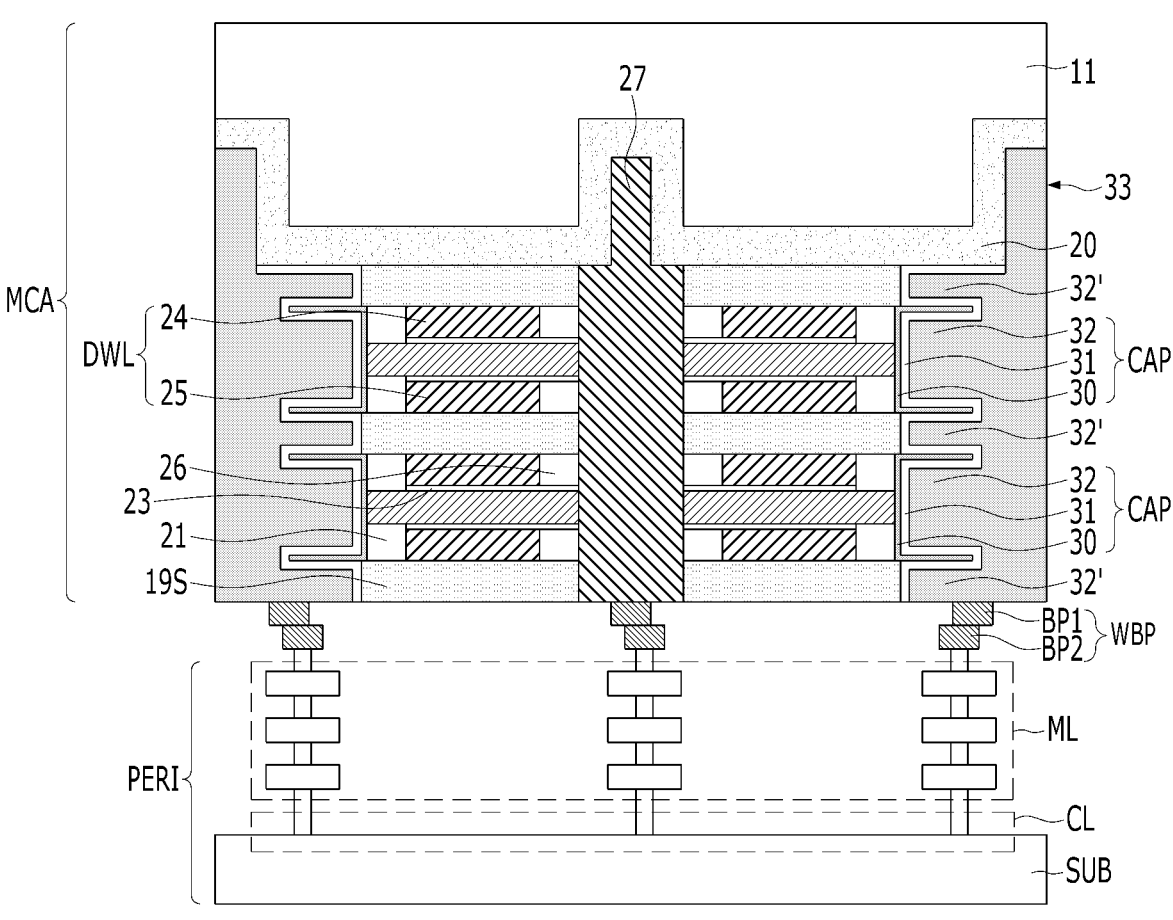
FIGS. 20 to 22 are diagrams for describing a method of manufacturing a semiconductor device according to another embodiment of the present invention.
Figure 21:
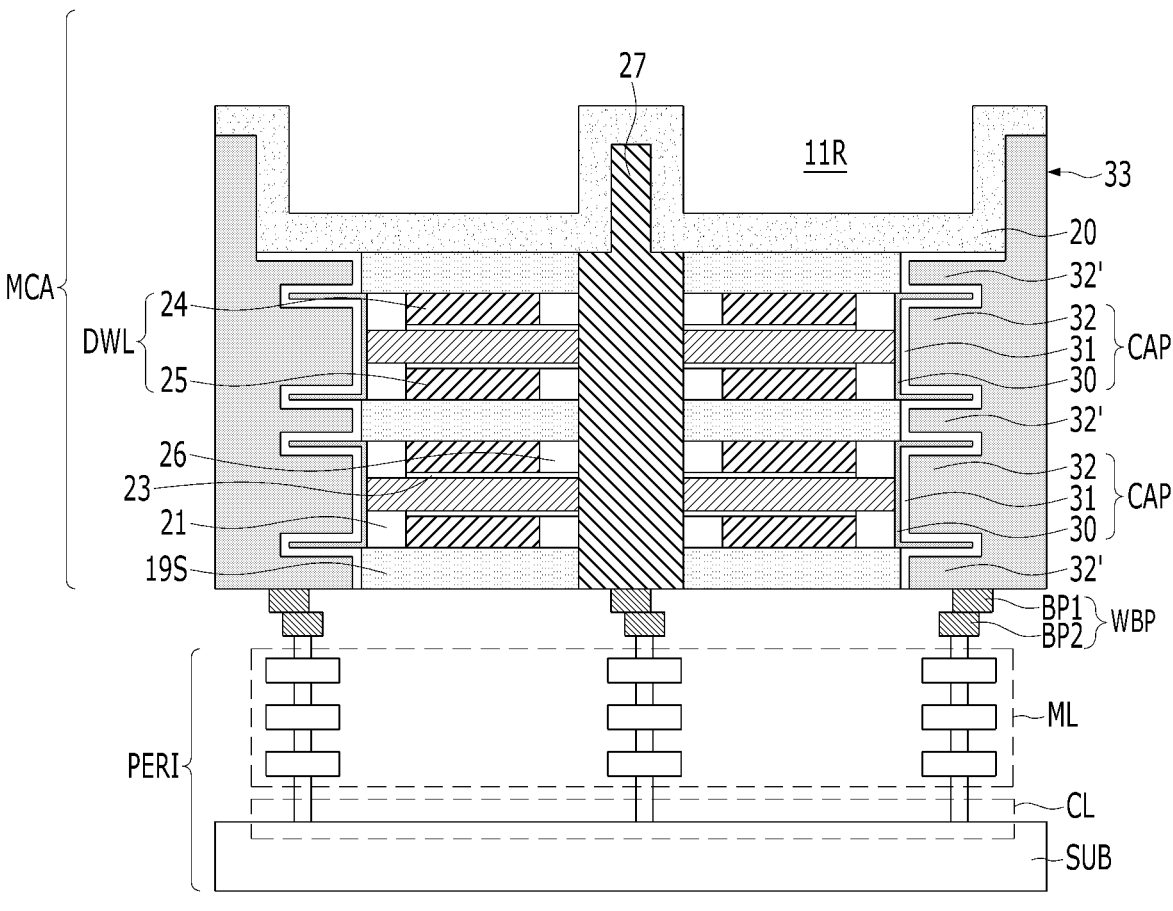
Figure 22:
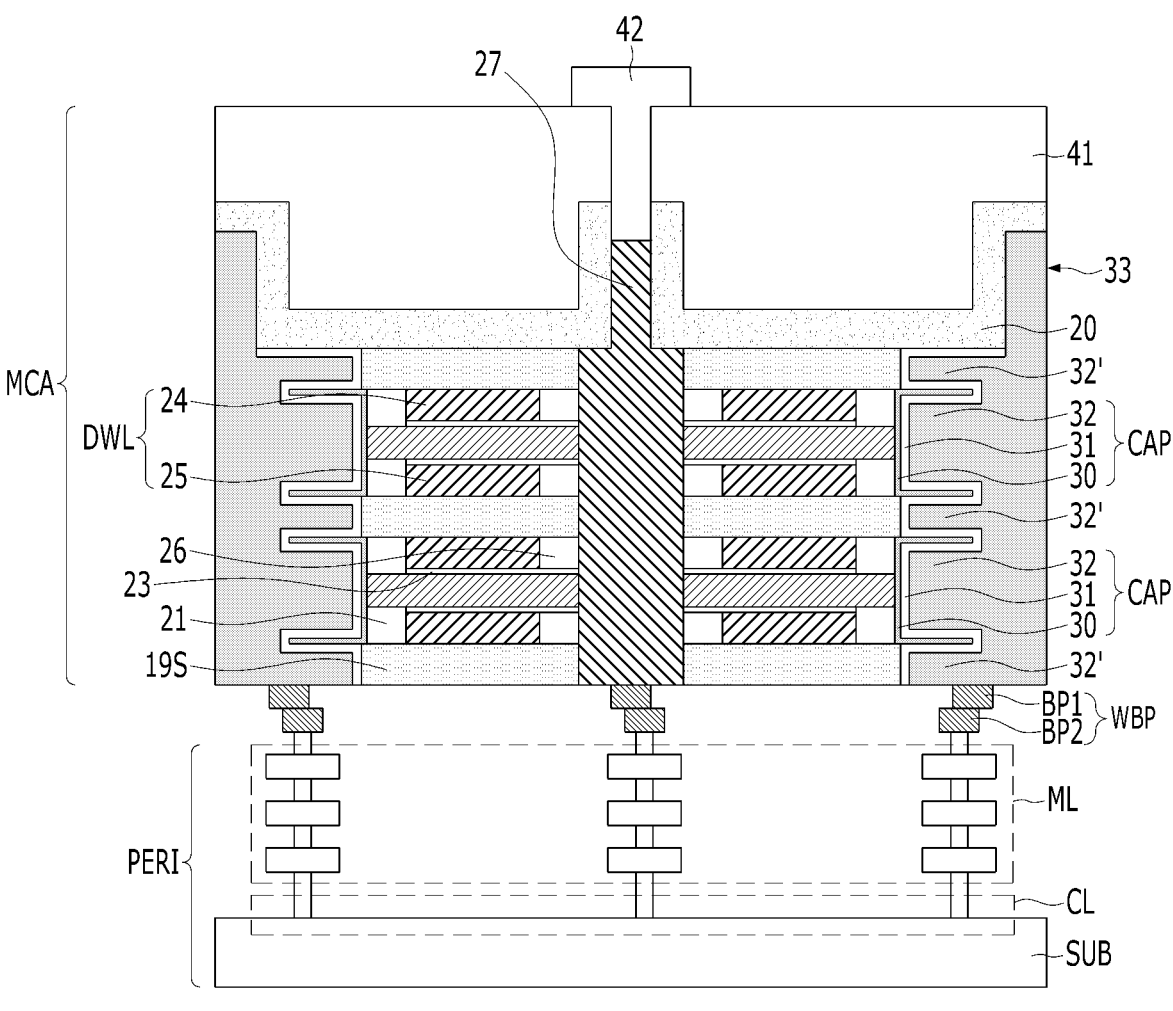

FIGS. 20 to 22 illustrate a method of manufacturing a semiconductor device according to another embodiment of the present invention. FIGS. 20 to 22 describe a method of connecting a memory cell array and a peripheral circuit portion by wafer bonding.

Subsequently to FIG. 19, as illustrated in FIG. 20, a plurality of first bonding pads BP1 may be formed. The first bonding pads BP1 may be coupled to the vertical conductive line 27 of a memory cell array MCA and the common plates 33.

The location of the vertical conductive line 27 may be changed by turning the lower structure 11 upside down. Accordingly, the first bonding pads BP1 may be disposed below the memory cell array MCA. The memory cell array MCA may be formed by the method described with reference to FIGS. 3 to 17. The top of the vertical conductive line 27 may be covered by the dielectric pad layer 20.

Next, a peripheral circuit portion PERI may be prepared. The peripheral circuit portion PERI may include a second substrate SUB and control circuits CL. The peripheral circuit portion PERI may further include multi-layer level interconnections ML. The multi-layer level interconnections ML may be coupled to the control circuits CL. The control circuits CL may include a sub-word line driver and a sense amplifier. The sub-word line driver of the control circuits CL may be coupled to the horizontal conductive lines DWL through the multi-layer level interconnections ML and the first bonding pads BP1. The sense amplifier of the control circuits CL may be coupled to the vertical conductive lines 27 through the multi-layer level interconnections ML and the first bonding pads BP1.

A plurality of second bonding pads BP2 may be formed over the multi-layer level interconnections ML. The second bonding pads BP2 may be coupled to the multi-layer level interconnections ML of the peripheral circuit portion PERI.

The first and second bonding pads BP1 and BP2 may include a metal-base material.

As described above, the memory cell array MCA may be disposed over the peripheral circuit portion PERI. A bonding structure WBP may be disposed between the peripheral circuit portion PERI and the memory cell array MCA. The bonding structure WBP may include the first bonding pads BP1 and the second bonding pads BP2.

The memory cell array MCA and the peripheral circuit portion PERI may be intercoupled by wafer bonding, that is, the first bonding pads BP1 and the second bonding pads BP2. Metal-to-metal bonding or hybrid bonding may be used as the wafer bonding. The metal-to-metal bonding may denote the bonding of the first bonding pads BP1 and the second bonding pads BP2. The hybrid bonding may denote a bonding method that further includes the bonding of bonding dielectric layers, in addition to the metal-to-metal bonding.

As illustrated in FIG. 21, the lower structure 11 may be selectively stripped (refer to reference numeral 11R). If the lower structure 11 includes a silicon substrate, a process of stripping the lower structure 11 may be performed by using wet etch capable of selectively stripping silicon. During the wet etching of the lower structure 11, the dielectric pad layer 20 may play a role as a barrier for the wet etch. Accordingly, an attack against the vertical conductive line 27 can be prevented.

The dielectric pad layer 20 can protect the memory cell array MCA and the peripheral circuit portion PERI against wet chemicals. Furthermore, the dielectric pad layer 20 can protect the memory cell array MCA when wafer bonding is performed.

As illustrated in FIG. 22, a front dielectric layer 41 that fills the space 11R from which the lower structure 11 has been removed may be formed. The front dielectric layer 41 may include, for example, silicon oxide. The front dielectric layer 41 might not expose the dielectric pad layer 20.

Next, a conductive pad that is coupled to the vertical conductive line 27 through the front dielectric layer 41, for example, a higher-level pad 42 may be formed. The higher-level pad 42 may penetrate a portion of the dielectric pad layer 20. The higher-level pad 42 may include a metal-base material.

Referring to FIGS. 20 to 22, the semiconductor device may include the peripheral circuit portion PERI and the memory cell array MCA. The memory cell array MCA may be disposed over the peripheral circuit portion PERI. The memory cell array MCA and the peripheral circuit portion PERI may be coupled by wafer bonding. The semiconductor device may have a cell over peri (COP) structure.

The memory cell array MCA may include a 3-D array of memory cells. For detailed descriptions of the memory cell array MCA and the memory cells, reference may be made to FIGS. 1 to 19. For example, the memory cell array MCA may correspond to the memory cell array MCA in FIG. 1.

The bonding structure WBP may be disposed between the peripheral circuit portion PERI and the memory cell array MCA. The bonding structure WBP may include the first bonding pads BP1 and the second bonding pads BP2. The memory cell array MCA and the peripheral circuit portion PERI may be intercoupled through the metal-to-metal bonding or the hybrid bonding. For example, the memory cell array MCA and the peripheral circuit portion PERI may be intercoupled through the first bonding pads BP1 and the second bonding pads BP2.

In another embodiment, the semiconductor device may have a peri over cell (POC) structure. The POC structure may denote a structure in which the peripheral circuit portion PERI is disposed over the memory cell array MCA.

FIGS. 23 to 27 are diagrams for describing a method of manufacturing a semiconductor device according to another embodiment of the present invention. A method described with reference to FIGS. 23 to 27 may be partially similar to the method described with reference to FIGS. 3 to 19.

First, the first semiconductor layers 13 and sacrificial semiconductor layers 12 of the stack body SB may be substituted with the sacrificial dielectric layers 18 and the cell isolation layer 19 by performing the series of processes illustrated in FIGS. 3 to 6. The second semiconductor layers 14 may become thinner as the horizontal layers 14S. While the sacrificial dielectric layers 18 are formed, the dummy sacrificial layer 18D that covers a surface of the lower structure 11 may be formed. The sacrificial dielectric layers 18 and the dummy sacrificial layer 18D may include the same material. The dummy sacrificial layer 18D may include silicon nitride.

Figure 23:
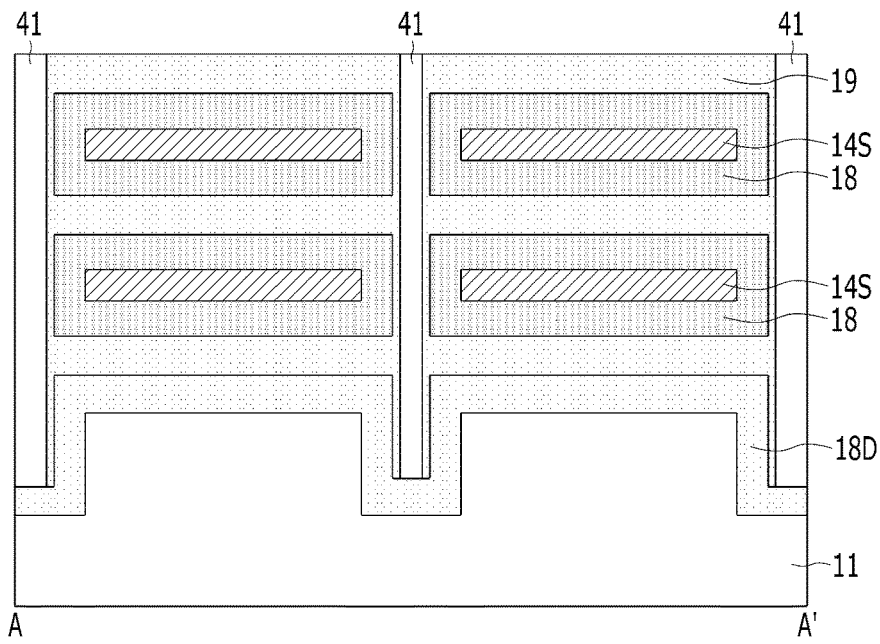
FIGS. 23 to 27 are diagrams for describing a method of manufacturing a semiconductor device according to another embodiment of the present invention.

As illustrated in FIG. 23, first sacrificial pillars 41 may be formed. The first sacrificial pillars 41 may include, for example, silicon oxide, silicon nitride, a carbon material, titanium nitride, or a combination of silicon oxide, silicon nitride, a carbon material, or titanium nitride.

Figure 24:
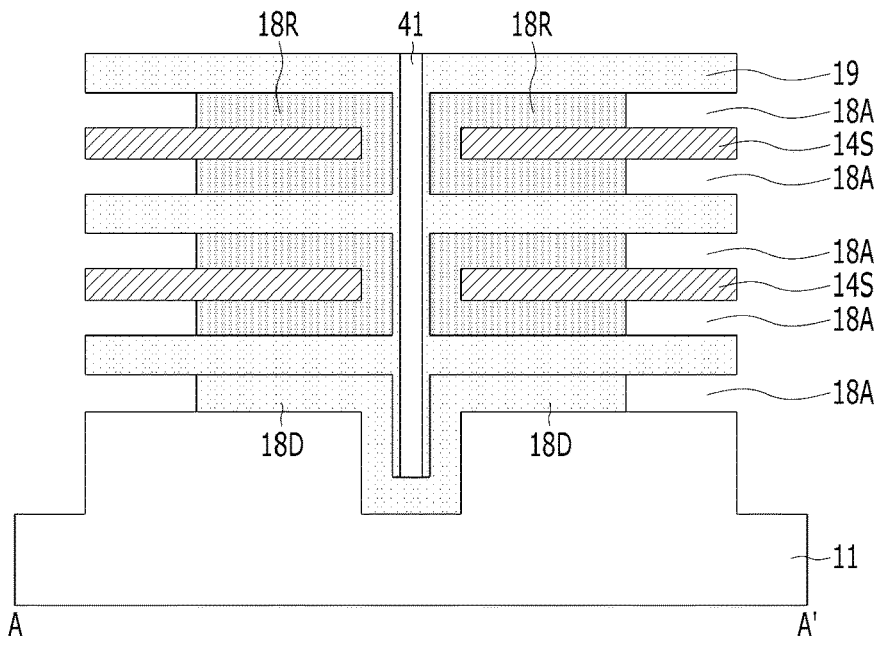

As illustrated in FIG. 24, after some of the first sacrificial pillars 41 are removed, the sacrificial patterns 18S may be recessed in order to form the sacrificial recesses 18A. The sacrificial recesses 18A may expose some surfaces of the horizontal layers 14S. After the sacrificial recesses 18A are formed, the sacrificial patterns may remain like reference numeral 18R.

Figure 25:
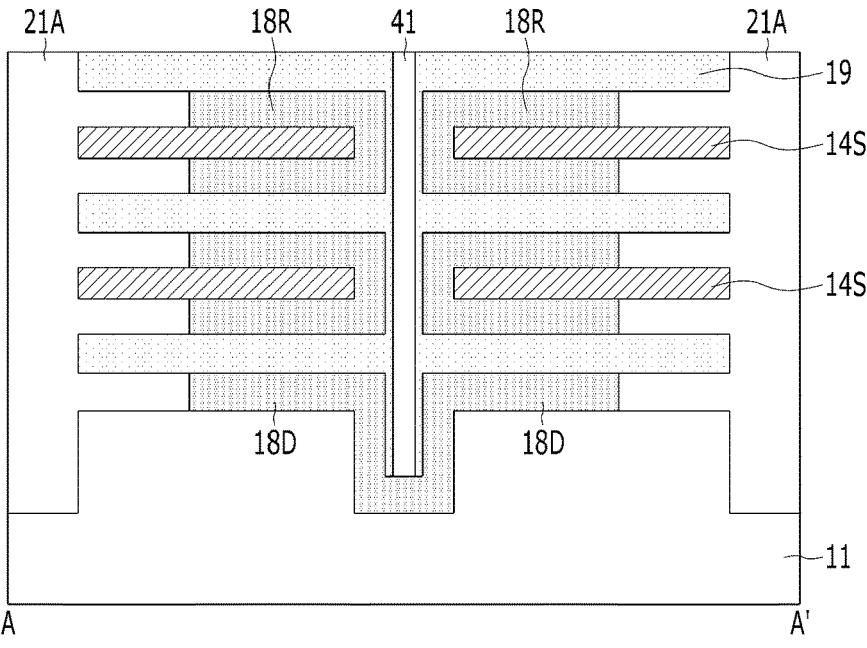

As illustrated in FIG. 25, the second sacrificial pillars 21A that fill the sacrificial recesses 18A may be formed. The second sacrificial pillars 21A may include, for example, silicon oxide, silicon nitride, or a combination of silicon oxide or silicon nitride. The second sacrificial pillars 21A may cover some surfaces of the horizontal layers 14S.

Figure 26:
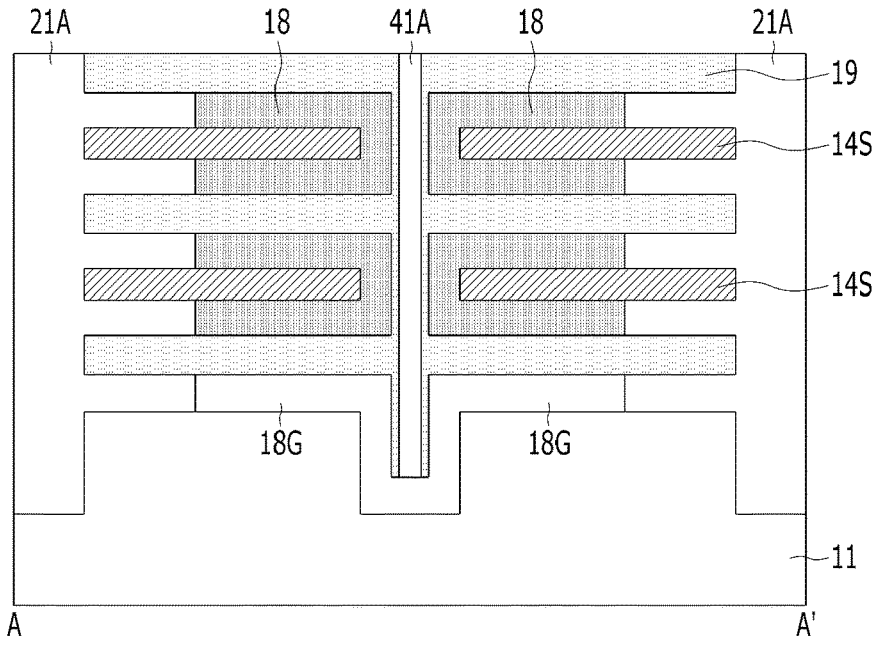

As illustrated in FIG. 26, in order to form vertical sacrificial opening 41A, the first sacrificial pillar 41 may be removed.

A bottom of the vertical sacrificial opening 41A may be extended up to the substrate 11 by etching a portion of the dummy sacrificial layer 18D.

Next, in order to form the air gap 18G between the cell isolation layer 19 and the lower structure 11, the dummy sacrificial layer 18D may be selectively removed.

Figure 27:
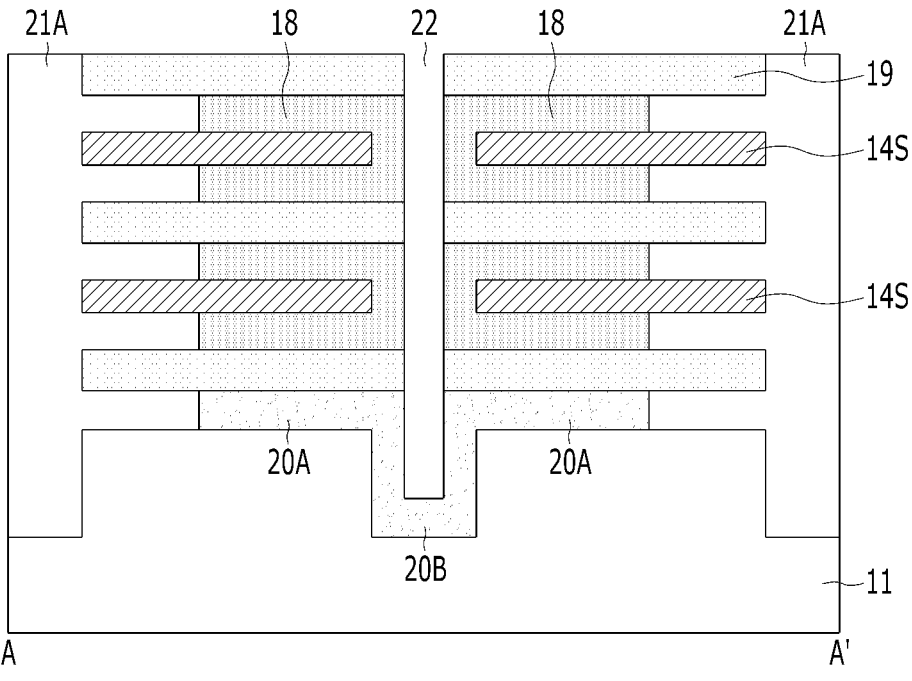

As illustrated in FIG. 27, a dielectric pad layer 20A that fills the air gap 18G may be formed. The dielectric pad layer 20A may include a dielectric material. The dielectric pad layer 20A and the cell isolation layer 19 may include the same material. The dielectric pad layer 20A and the sacrificial dielectric layers 18 may include different materials. The dielectric pad layer 20A may include, for example, silicon oxide. The dielectric pad layer 20A may be formed, for example, by a deposition process or an oxidation process. The dielectric pad layer 20A may cover the surface of the lower structure 11. The dielectric pad layer 20A may be formed by dry oxidation or wet oxidation. The dielectric pad layer 20A may include, for example, silicon oxide, SiCO, SiCN, SiCON, or a combination of silicon oxide, SiCO, SiCN, or SiCON.

In order to form the dielectric pad layer 20A, the deposition of a dielectric material and an etch-back process may be performed.

After the dielectric pad layer 20A is formed, a bottom pad layer 20B may be formed by oxidizing a surface of the substrate 11. The bottom pad layer 20B may include, for example, silicon oxide.

Next, the first vertical opening 22 may be formed by recessing the cell isolation layers 19.

Subsequently, the series of processes described with reference to FIGS. 12 to 19 may be performed.

Figure 28:
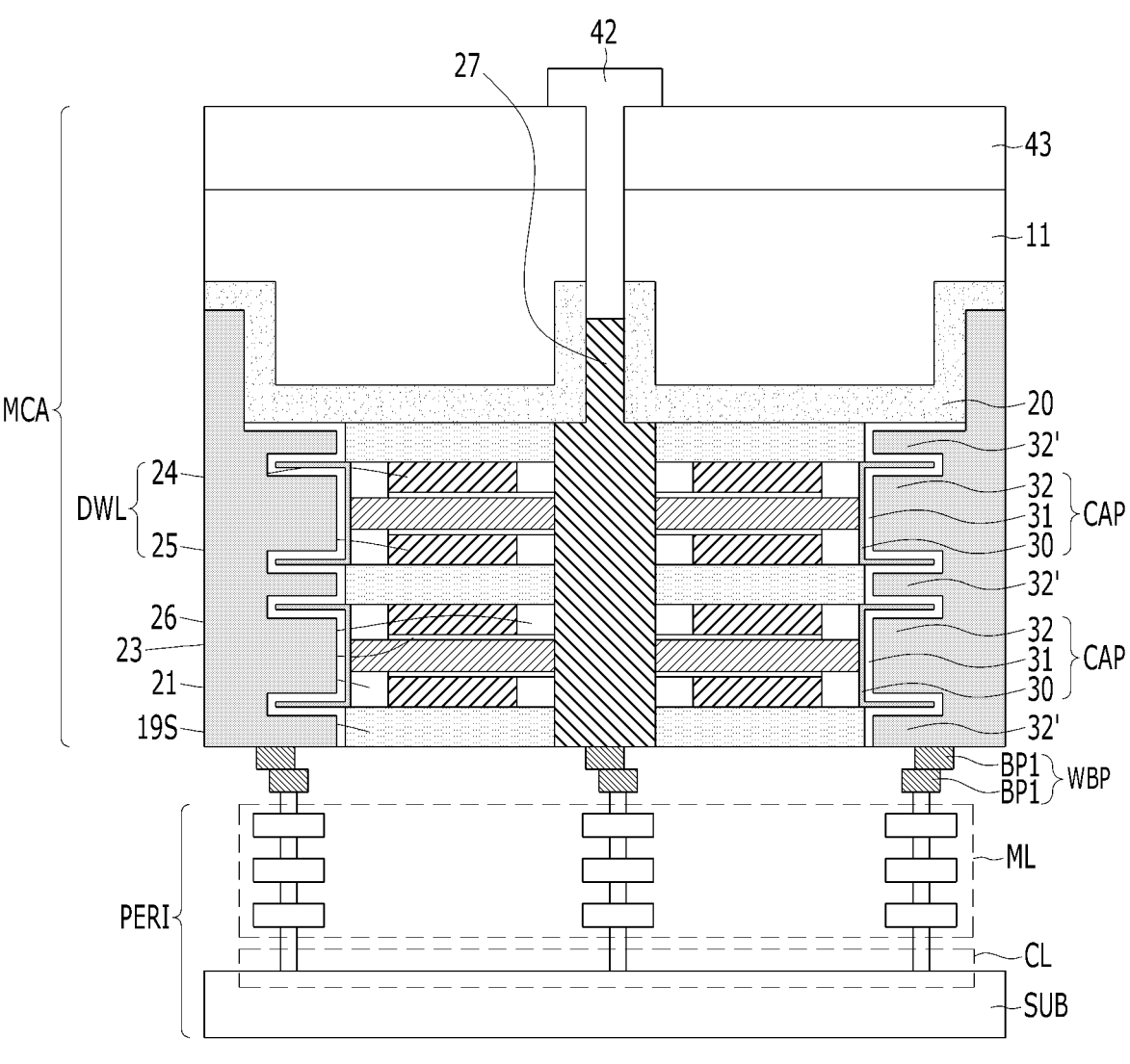
FIG. 28 is a schematic cross-sectional view of a semiconductor device according to another embodiment of the present invention.

FIG. 28 is a schematic cross-sectional view of a semiconductor device according to another embodiment of the present invention. The semiconductor device in FIG. 28 may be similar to the semiconductor device in FIG. 22.

Referring to FIG. 28, the semiconductor device may include a peripheral circuit portion PERI and a memory cell array MCA. The memory cell array MCA may be disposed over the peripheral circuit portion PERI. The memory cell array MCA and the peripheral circuit portion PERI may be coupled by wafer bonding. The semiconductor device may have a cell over peri (COP) structure.

The memory cell array MCA may include a 3-D array of memory cells. For detailed descriptions of the memory cell array MCA and the memory cells, reference may be made to FIGS. 1 to 19. For example, the memory cell array MCA may correspond to the memory cell array MCA in FIG. 1.

A bonding structure WBP may be disposed between the peripheral circuit portion PERI and the memory cell array MCA. The bonding structure WBP may include first bonding pads BP1 and second bonding pads BP2. The memory cell array MCA and the peripheral circuit portion PERI may be intercoupled by the metal-to-metal bonding or the hybrid bonding. For example, the memory cell array MCA and the peripheral circuit portion PERI may be intercoupled through first bonding pads BP1 and second bonding pads BP2.

In the semiconductor device in FIG. 28, a higher-level pad 42 may be formed in the state in which a lower structure 11 remains. For example, if the lower structure 11 includes a silicon substrate, a process of stripping the lower structure 11 may be omitted.

Before the higher-level pad 42 is formed, a dielectric material layer 43 may be formed on the lower structure 11.

It will be evident to a person having ordinary knowledge in the art to which the present disclosure pertains that the present disclosure described above is not limited by the aforementioned embodiments and the accompanying drawings and that the present disclosure may be substituted, modified, and changed in various ways without departing from the technical spirit of the present disclosure.

What is claimed is:

1. A semiconductor device comprising:
a peripheral circuit portion;
a memory cell array disposed over the peripheral circuit portion and comprising a vertical conductive line;
a bonding pad structure between the peripheral circuit portion and the memory cell array;
a dielectric pad layer that covers a top of the vertical conductive line of the memory cell array; and
a higher-level pad that is coupled to the vertical conductive line through the dielectric pad layer.

2. The semiconductor device of claim 1, wherein the dielectric pad layer comprises a dielectric material.

3. The semiconductor device of claim 1, wherein the memory cell array comprises a plurality of memory cells that share the vertical conductive line and that are vertically stacked in a direction in which the vertical conductive line extends.

4. The semiconductor device of claim 1, wherein the memory cell array comprises:
a horizontal layer that is oriented horizontally from the vertical conductive line;
a horizontal conductive line that extends in a direction that intersects the horizontal layer; and
a data storage element that is coupled to the horizontal layer.

5. The semiconductor device of claim 4, wherein the horizontal layer comprises a semiconductor material or an oxide semiconductor material.

6. The semiconductor device of claim 4, wherein the data storage element comprises a capacitor.

7. The semiconductor device of claim 1, wherein the memory cell array comprises:

a first edge slit and a second edge slit that are spaced apart from each other and disposed over the dielectric pad layer;

an isolation slit that is disposed between the first edge slit and the second edge slit;

a first horizontal conductive line stack that is disposed between the first edge slit and the isolation slit;

a second horizontal conductive line stack that is disposed between the second edge slit and the isolation slit; and a plurality of supporting elements that are adjacent to the isolation slit and that comprise the first horizontal conductive line stack and the second horizontal conductive line stack, respectively.

8. The semiconductor device of claim 7, wherein each of the first edge slit and the second edge slit comprises an array of pillar type slits.

9. A semiconductor device comprising:

a lower structure;

a dielectric pad layer that covers an upper surface of the lower structure;

a first edge slit and a second edge slit that are spaced apart from each other and disposed over the dielectric pad layer;

an isolation slit that is disposed between the first edge slit and the second edge slit;

a first horizontal conductive line stack that is disposed between the first edge slit and the isolation slit;

a second horizontal conductive line stack that is disposed between the second edge slit and the isolation slit; and a plurality of supporting elements that are adjacent to the isolation slit and that comprise the first horizontal conductive line stack and the second horizontal conductive line stack.

10. The semiconductor device of claim 9, wherein the dielectric pad layer comprises a dielectric material.

11. The semiconductor device of claim 9, wherein the first edge slit and the second edge slit horizontally extend in directions in which the first and second horizontal conductive lines extend, respectively.

12. The semiconductor device of claim 9, wherein each of the first edge slit and the second edge slit comprises an array of pillar type slits.

13. The semiconductor device of claim 9, wherein the first and second edge slits extend in a direction that is perpendicular to a surface of the dielectric pad layer.

14. The semiconductor device of claim 9, wherein the isolation slit, the supporting elements, and the first and second edge slits are disposed to be spaced apart from each other, and extend in a direction that is vertical to a surface of the dielectric pad layer.

15. The semiconductor device of claim 9, wherein the isolation slit, the supporting elements, and the first and second edge slits comprise a dielectric material.

16. The semiconductor device of claim 9, wherein each of the first and second horizontal conductive line stacks comprises a plurality of word lines that are stacked in a direction that is perpendicular to a surface of the dielectric pad layer.

* * * * *